US012169227B2

(12) United States Patent
Nakayama et al.

(10) Patent No.: US 12,169,227 B2
(45) Date of Patent: Dec. 17, 2024

(54) TESTING DEVICE AND TESTING METHOD FOR POWER CONVERTERS

(71) Applicant: Mitsubishi Electric Corporation, Tokyo (JP)

(72) Inventors: Akito Nakayama, Tokyo (JP); Yuki Ishii, Tokyo (JP); Takuya Kajiyama, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 359 days.

(21) Appl. No.: 17/762,374

(22) PCT Filed: Nov. 12, 2019

(86) PCT No.: PCT/JP2019/044417
§ 371 (c)(1),
(2) Date: Mar. 22, 2022

(87) PCT Pub. No.: WO2021/095141
PCT Pub. Date: May 20, 2021

(65) Prior Publication Data
US 2022/0397616 A1 Dec. 15, 2022

(51) Int. Cl.
*G01R 31/56* (2020.01)
*H02M 1/00* (2007.01)
(Continued)

(52) U.S. Cl.
CPC .......... *G01R 31/56* (2020.01); *H02M 1/0016* (2021.05); *H02M 7/483* (2013.01);
(Continued)

(58) Field of Classification Search
CPC .. G01R 31/56; H02M 7/483; H02M 7/53871; H02M 1/0016; H02M 3/33573;
(Continued)

(56) References Cited

U.S. PATENT DOCUMENTS 10,560,036 B2 * 2/2020 Fujii ................. H02M 7/53871
2017/0141569 A1 5/2017 Liu et al.
(Continued)

FOREIGN PATENT DOCUMENTS

CN 108051685 A 5/2018
EP 3 352 361 A1 7/2018
(Continued)

OTHER PUBLICATIONS

CN 108051685 machine translation, May 18, 2018 (Year: 2018).*
(Continued)

*Primary Examiner* — Raul J Rios Russo
(74) *Attorney, Agent, or Firm* — XSENSUS LLP

(57) ABSTRACT

A power converter to be tested is supplied with arm current from a hysteresis converter in a state in which it is connected to an auxiliary converter through a line. In the power converter and the auxiliary converter, a circulation operation is performed in which a current path bypassing power storage elements is formed between an output terminal of the power converter and an output terminal of the auxiliary converter, after the start of output of arm current in accordance with a reference current command value in which an AC component and a DC component are superimposed, until a DC component of arm current reaches a predetermined level. After execution of the circulation operation, in the power converter and the auxiliary converter, voltage control of the power storage elements and the output terminals is started.

20 Claims, 15 Drawing Sheets

(51) Int. Cl.
*H02M 3/335* (2006.01)
*H02M 7/483* (2007.01)
*H02M 7/5387* (2007.01)

(52) U.S. Cl.
CPC .... *H02M 7/53871* (2013.01); *H02M 3/33573* (2021.05); *H02M 3/33592* (2013.01)

(58) Field of Classification Search
CPC .......... H02M 3/33592; H02M 7/4833; H02M 7/4835; H02M 1/36
USPC ....................................................... 324/537
See application file for complete search history.

(56) References Cited

U.S. PATENT DOCUMENTS

| | | | |
|---|---|---|---|
| 2019/0044455 A1* | 2/2019 | Fujii | H02M 7/4835 |
| 2019/0245446 A1* | 8/2019 | Jojima | H02M 3/1588 |
| 2022/0393616 A1* | 12/2022 | Fujiwara | H02M 7/5395 |
| 2023/0170822 A1* | 6/2023 | Fujiwara | H02M 7/4835 363/68 |

FOREIGN PATENT DOCUMENTS

| | | |
|---|---|---|
| JP | 2016-10295 A | 1/2016 |
| JP | 2017-99252 A | 6/2017 |

OTHER PUBLICATIONS

International Search Report and Written Opinion mailed on Jan. 28, 2020, received for PCT Application PCT/JP2019/044417, Filed on Nov. 12, 2019, 6 pages including English Translation.

Tang et al., "Design and Control of a Compensated Submodule Testing Scheme for Modular Multilevel Converter", IEEE Applied Power Electronics Conference and Exposition (APEC), 2016, pp. 2645-2651.

Tang et al., "A Model Assisted Testing Scheme for Modular Multilevel Converter", IEEE Transaction on Power Electronics, vol. 31, No. 1, Jan. 2016, pp. 165-176.

Extended European Search Report issued Oct. 13, 2022 in corresponding European Patent Application No. 19952838.1, 10 pages.

Yuan Tang, et al., "Improved Testing Capability of the Model-Assisted Testing Scheme for a Modular Multilevel Converter", IEEE Transactions on Power Electronics, Institute of Electrical and Electronics Engineers, USA, vol. 31, No. 11, (Nov. 1, 2016), pp. 7823-7836, XP011615257.

Seleme Isaac Seleme Jr., et al., "Modular control with carrier auto-interleaving and capacitor-voltage balancing for MMCs", IET Power Electronics, IET, UK, (Apr. 10, 2019), vol. 12, No. 4, pp. 817-828, XP006083913.

Office Action issued Mar. 14, 2024 in European Patent Application No. 19 952 838.1, 6 pages.

* cited by examiner

TESTING DEVICE AND TESTING METHOD FOR POWER CONVERTERS

CROSS-REFERENCE TO RELATED APPLICATION

The present application is based on PCT filing PCT/JP2019/044417, filed Nov. 12, 2019, the entire contents of which is incorporated herein by reference.

TECHNICAL FIELD

The present disclosure relates to a testing device and a testing method for power converters.

BACKGROUND ART

In power conversion devices for use in high voltage applications such as power systems, multilevel converters formed with a plurality of converter cells connected in series in multiple stages have recently been put to practice. These converters are called modular multilevel converter (MMC) systems or cascaded multilevel converter (CMC) systems.

For testing a single cell of these converters, for example, Japanese Patent Laying-Open No. 2016-10295 (PTL 1) and NPL 1 below describe a testing system for performing operation verification for each converter by simulating current similar to that in actual operation and feeding the current through a converter cell.

In PTL 1, a bridge circuit including a plurality of bridge-connected converters (MMC) operates such that DC power from a DC power source is converted to be supplied to an AC load, whereby voltage and current supplied per converter in actual operation are simulated to verify the operation of each converter. NPL 1 describes a testing system including a unit converter, an auxiliary converter having substantially the same structure as the unit converter, a hysteresis converter, and a reactor.

CITATION LIST

Patent Literature

PTL 1: Japanese Patent Laying-Open No. 2016-10295

Non Patent Literature

NPL 1: Yung Tang, Li Ran et al, "Design and Control of a Compensated Submodule Testing Scheme for Modular Multilevel Converter", 2016 IEEE Applied Power Electronics Conference and Exposition (APEC)

SUMMARY OF INVENTION

Technical Problem

Unfortunately, in PTL 1, at least four converters (MMC) need be connected to form a bridge circuit, and a DC reactor is connected to each converter. This configuration may lead to size increase of the testing system.

The configuration in NPL 1 is useful as a testing system for a unit converter, but there is no mention as to initial charging of a capacitor included in the unit converter to be tested. On the other hand, in initial charging immediately after start of testing, the capacitor voltage may become unbalanced between the unit converter and the auxiliary converter to cause unstable circuit operation.

The present disclosure is made in order to solve such a problem, and an object of the present disclosure is to stabilize circuit operation at the start of testing a power converter.

Solution to Problem

An aspect of the present disclosure provides a testing device for a power converter. The power converter to be tested includes first and second main switching elements connected in series through a first terminal, and a first power storage element connected in parallel with a series connection of the first and second main switching elements. The testing device includes an auxiliary converter, a line electrically connecting the power converter and the auxiliary converter, a current output circuit, and a control circuit to control the current output circuit, the power converter, and the auxiliary converter. The auxiliary converter includes a series connection of first and second auxiliary switching elements connected in series through a second terminal, and a second power storage element connected in parallel with the series connection. The current output circuit is connected to the first and second terminals and outputs test current for the power converter in accordance with a reference current command value in which an AC current command value and a DC current command value are superimposed. The control circuit executes circulation operation to fix ON and OFF of the first and second main switching elements and the first and second auxiliary switching elements such that a current path bypassing the first and second power storage elements is formed between the first and second terminals until a DC component of the test current reaches a predetermined level, after start of output of the test current from the current output circuit in accordance with the reference current command value. Further, the control circuit starts ON and OFF control of the first and second main switching elements and the first and second auxiliary switching elements for voltage control at least including control of voltages of the first and second power storage elements in accordance with a power storage element voltage command value, after the DC component reaches the predetermined level.

Another aspect of the present disclosure provides a testing method for a power converter. The power converter to be tested includes first and second main switching elements connected in series through a first terminal, and a first power storage element connected in parallel with a series connection of the first and second main switching elements. The power converter is tested in a state in which the power converter is electrically connected to an auxiliary converter through a line, the auxiliary converter including a series connection of first and second auxiliary switching elements connected in series through a second terminal, and a second power storage element connected in parallel with the series connection. The testing method includes the steps of: after start of output of test current from a current output circuit connected to the first and second terminals in accordance with a reference current command value in which an AC current command value and a DC current command value are superimposed, executing a circulation operation until a DC component of the test current reaches a predetermined level; and after the DC component reaches the predetermined level, starting ON and OFF control of the first and second main switching elements and the first and second auxiliary switching elements for voltage control at least including control of voltages of the first and second power storage elements in accordance with a power storage element voltage command value. In the circulation operation, in the power converter and the auxiliary converter, ON and OFF of the first and second main switching elements and the first and second auxiliary switching elements are fixed such that a current path bypassing the first and second power storage elements is formed between the first and second terminals.

Advantageous Effects of Invention

According to the present disclosure, voltage control of the first and second power storage elements in accordance with the power storage element voltage command value is started after the DC component of test current supplied to the power converter and the auxiliary converter rises, so that the only active power that flows from the power output circuit to the power converter and the auxiliary converter is the power under voltage control of the first and second power storage elements. Consequently, the voltage between first and second power storage elements can be prevented from abruptly becoming unbalance at the start of testing of the power converter, and the circuit operation can be stabilized.

DESCRIPTION OF EMBODIMENTS

Figure 1:
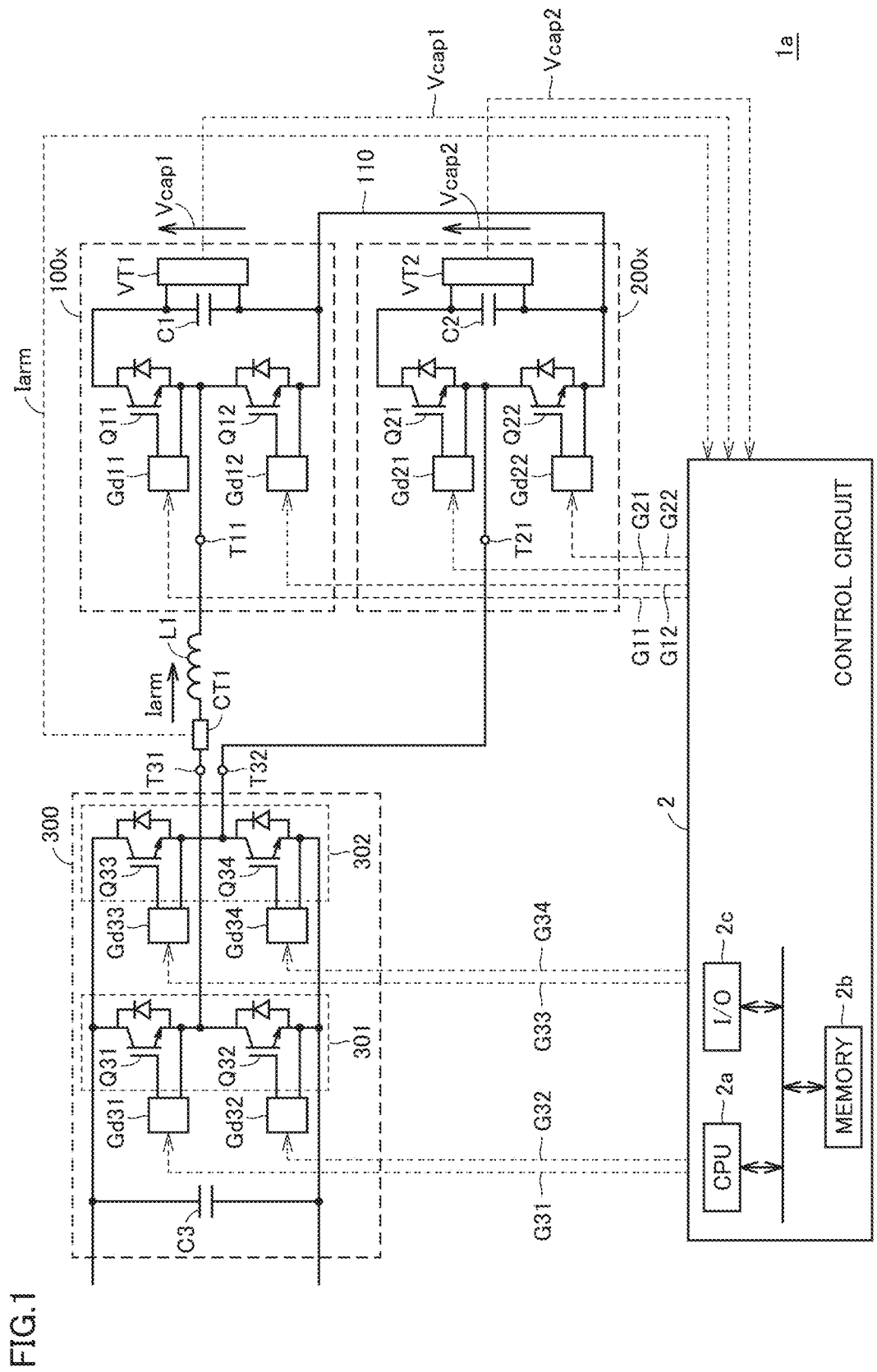
FIG. 1 is a circuit diagram illustrating a configuration example of a testing system including a testing device according to the present embodiment.

Embodiments of the present disclosure will be described in detail below with reference to the drawings. In the following, like or corresponding parts in the drawings are denoted by like reference signs and a description thereof is basically not repeated.

First Embodiment

FIG. 1 is a circuit diagram illustrating a first configuration example of a testing system including a testing device according to the present embodiment.

Referring to FIG. 1, a testing system 1a according to the present embodiment includes a control circuit 2, a power converter 100x to be tested, an auxiliary converter 200x, a line 110, and a current output circuit for outputting test current that simulates actual operation. The current output circuit can be configured with a hysteresis converter 300 and a reactor L1. Hereinafter the inductance value of reactor L1 is also denoted by L1. The part of testing system 1a excluding power converter 100x to be tested forms the testing device according to the present embodiment.

Power converter 100x to be tested includes, for example, switching elements Q11 and Q12 connected in series and a power storage element C1. Hereinafter the capacitance of power storage element C1 is also denoted by C1. Power storage element C1 is connected in parallel with a series connection of switching elements Q11 and Q12. The connection node of switching elements Q11 and Q12 is connected to an output terminal T11. That is, switching elements Q11 and Q12 are connected in series through output terminal T11. Switching element Q11 is driven ON and OFF by a gate drive circuit Gd11, and switching element Q12 is driven ON and OFF by a gate drive circuit Gd12.

In power converter 100x, output terminal T11 corresponds to "first terminal", switching elements Q11 and Q12 correspond to "first and second main switching elements", and power storage element C1 corresponds to "first power storage element".

Auxiliary converter 200x has a configuration similar to power converter 100x and includes switching elements Q21 and Q22 connected in series and a power storage element C2. Hereinafter the capacitance of power storage element C2 is also denoted by C2. Power storage element C2 is connected in parallel with a series connection of switching elements Q21 and Q22. Switching elements Q21 and Q22 are connected in series through an output terminal T21. Switching element Q21 is driven ON and OFF by a gate drive circuit Gd21, and switching element Q22 is driven ON and OFF by a gate drive circuit Gd22.

Although auxiliary converter 200x has a circuit configuration similar to power converter 100x, the constituent elements need not be completely identical. For example, there may be a difference in that switching elements Q11 and Q12 of power converter 100x are formed of silicon carbide (SiC)-metal oxide semiconductor field effect transistors (MOSFETs), whereas switching elements Q21 and Q22 of auxiliary converter 200x are formed of Si-insulated gate bipolar transistors (IGBTs).

In auxiliary converter 200x, output terminal T21 corresponds to "second terminal", switching elements Q21 and Q22 correspond to "first and second auxiliary switching elements", and power storage element C2 corresponds to "second power storage element".

Hysteresis converter 300 includes a first leg 301, a second leg 302, and a power storage element C3. First leg 301 includes switching elements Q31 and Q32 connected in series through a terminal T31. Second leg 302 includes switching elements Q33 and Q34 connected in series through a terminal T32. First leg 301, second leg 302, and power storage element C3 are connected in parallel. Switching elements Q31 to Q34 are driven ON and OFF by gate drive circuits Gd31 to Gd34.

Reactor L1 is connected between terminal T31 of hysteresis converter 300 and output terminal T11 of power converter 100x. Terminal T32 of hysteresis converter 300 is electrically connected to output terminal T21 of auxiliary converter 200x. Reactor L1 may be connected between terminal T32 of hysteresis converter 300 and output terminal T21 of auxiliary converter 200x. In this case, terminal T31 of hysteresis converter 300 and output terminal T11 of power converter 100x may be electrically connected, not through the reactor. That is, reactor L1 is connected at least one of: between terminal T31 and output terminal T11; and between terminal T32 and output terminal T21. Hereinafter the inductance of reactor L1 is also denoted by L1.

Line 110 connects the respective negative electrodes of power storage element C1 of power converter 100x and power storage element C2 of auxiliary converter 200x. Thus, a current path in which current Iarm (hereinafter also referred to as arm current Iarm) output from hysteresis converter 300 for testing power converter 100x passes through power converter 100x and auxiliary converter 200x can be formed between terminals T31 and T32 of hysteresis converter 300. That is, terminal T31 corresponds to "first test terminal", terminal T32 corresponds to "second test terminal", and arm current Iarm corresponds to an embodiment of "test current".

Control circuit 2 controls the operation of power converter 100x, auxiliary converter 200x, and hysteresis converter 300. For example, control circuit 2 can be configured with a microprocessor including a central processing unit (CPU) 2a, a memory 2b, and an input/output (I/O) circuit 2c. Input/output circuit 2c executes input of detection values by sensors arranged in testing system 1a and output of control signals to constituent elements of testing system 1a.

Control circuit 2 can implement control functions illustrated in the block diagrams described later through software processing in which CPU 2a executes computational processing under instructions of a program stored in memory 2b. Alternatively, control circuit 2 may implement some or all of the control functions through hardware processing by dedicated electronic circuitry.

In testing system 1a, in power converter 100x, a sensor VT1 is arranged for detecting a voltage Vcap1 (hereinafter also referred to as capacitor voltage Vcap1) of power storage element C1. Similarly, in auxiliary converter 200x, a sensor VT2 is arranged for detecting a voltage Vcap2 (hereinafter referred to as capacitor voltage Vcap2) of power storage element C2. Further, in testing system 1a, a sensor CT1 is arranged for detecting arm current Iarm. The detection values by these sensors VT1, VT2, and CT1 are transmitted to control circuit 2.

Control circuit 2 generates gate signals G31 to G34 for controlling ON and OFF of switching elements Q31 to Q34 included in hysteresis converter 300, gate signals G11 and G12 for controlling ON and OFF of switching elements Q11 and Q12 included in power converter 100x, and gate signals G21 and G22 for controlling ON and OFF of switching elements Q21 and Q22 included in auxiliary converter 200x.

Gate signals G11, G12, G21, G22, and G31 to G34 are transmitted to gate drive circuits Gd11, Gd12, Gd21, Gd22, and Gd31 to Gd34. Gate drive circuits Gd11, Gd12, Gd21, Gd22, and Gd31 to Gd34 drive switching elements Q11, Q12, Q21, Q22, and Q31 to Q34 ON and OFF, in response to gate signals G11, G12, G21, G22, and G31 to G34. Gate signals G11, G12, G21, G22, and G31 to G34 may be transmitted to gate drive circuits Gd11, Gd12, Gd21, Gd22, and Gd31 to Gd34 in the form of optical signals using an optical fiber or in the form of electrical signals using a cable.

Power supply for driving control circuit 2, gate drive circuits Gd11, Gd12, Gd21, Gd22, Gd31 to Gd34, and sensors VT1, VT2, and CT1 can be supplied using an external power source such as a not-shown switching power supply. Alternatively, a main circuit power supply device used as the power supply by a voltage conversion function from stored energy of power storage elements C1 and C2 may be arranged.

Control of power converter 100x, auxiliary converter 200x, and hysteresis converter 300 by control circuit 2 will now be described.

Figure 2:
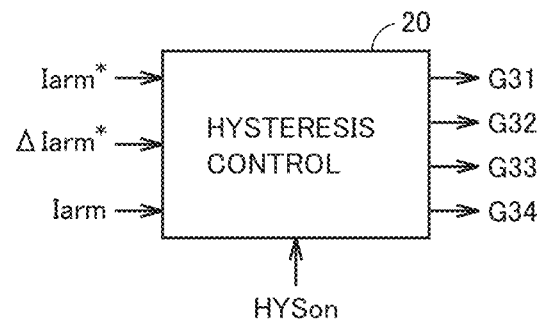
FIG. 2 is a block diagram illustrating a control configuration of a hysteresis converter.

FIG. 2 is a block diagram illustrating a control configuration of hysteresis converter 300.

Referring to FIG. 2, control circuit 2 shown in FIG. 1 includes a hysteresis control unit 20. Hysteresis control unit 20 controls arm current Iarm output from hysteresis converter 300, in accordance with a reference current command value Iarm*. Specifically, arm current Iarm is controlled in a certain range defined by a hysteresis width command value ΔIarm* around the reference current command value Iarm*. As described above, arm current Iarm passes through reactor L1, power converter 100x, and auxiliary converter 200x and is detected by sensor CT1.

Figure 3:
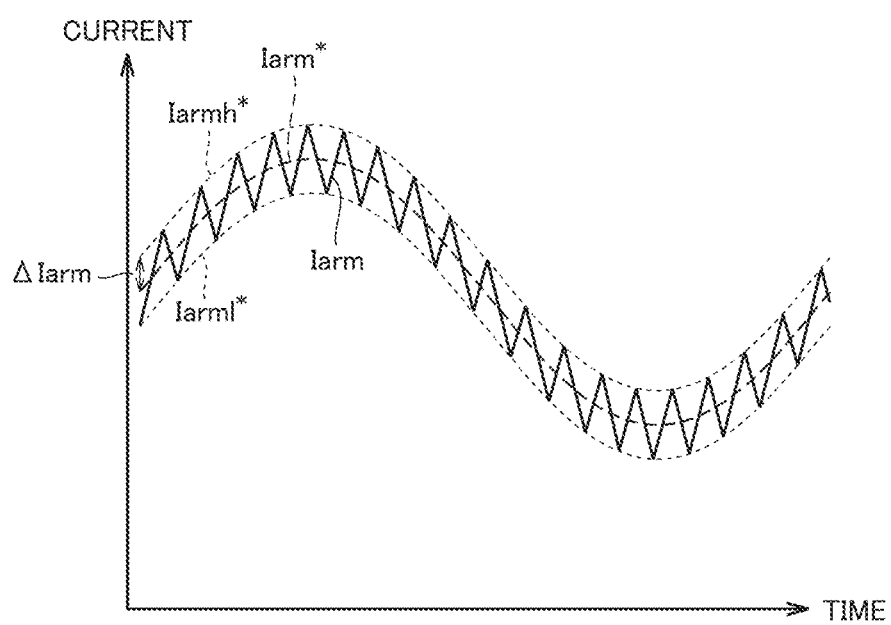
FIG. 3 is a waveform diagram of arm current for explaining control operation of the hysteresis converter.

FIG. 3 shows a waveform diagram of arm current Iarm for explaining control operation of hysteresis converter 300.

Referring to FIG. 3, the reference current command value Iarm* is expressed by the following equation (1) in which a DC current command value Idc* and an AC current command value Iac*·sin(ωt+θ) are superimposed.

$$Iarm^* = Idc^* + Iac^* \cdot \sin(\omega t + \theta) \quad (1)$$

In equation (1), for time t, ω and θ represent the angular frequency and the phase of an AC component. Passage current in actual operation of each converter cell of the MMC can be simulated by applying the reference current command value Iarm* by superimposing the DC current command value (Idc*) and the AC current command value (Iac*·sin(ωt+θ)). Although the DC component (DC current command value) Idc* may be set to a negative value (the direction in which current flows from power converter 100x into hysteresis converter 300), a case of Idc*>0 will be described below.

An upper limit current command value Iarmh*(=Iarm*+ΔIarm) and a lower limit current command value Iarml* (=Iarm*−ΔIarm) are set based on the reference current command value Iarm* and the preset hysteresis width command value ΔIarm.

Referring to FIG. 1 again, in hysteresis converter 300, in a first period in which switching elements Q31 and Q34 are turned ON and switching elements Q32 and Q33 are turned OFF, a positive pulse voltage with DC voltage of power storage element C3 as an amplitude is output between terminals T31 and T32. Conversely, in a second period in which switching elements Q32 and Q33 are turned ON and switching elements Q31 and Q34 are turned ON, a negative pulse voltage with DC voltage of power storage element C3 as an amplitude is output between terminals T31 and T32. In the first period in which a positive pulse voltage is output, arm current Iarm rises, while in the second period in which a negative pulse voltage is output, arm current Iarm lowers.

Referring to FIG. 2 and FIG. 3 again, hysteresis control unit 20 generates gate signals G31 to G34, based on comparison of the detected arm current Iarm with the upper limit current command value Iarmh* and the lower limit current command value Iarml*.

Specifically, in the first period in which arm current Iarm rises, the first period is kept until arm current Iarm reaches the upper limit current command value Iarmh*. That is, gate signals G31 to G34 are generated such that switching elements Q31 and Q34 are turned ON and switching elements Q32 and Q33 are turned OFF.

When the rising arm current Iarm reaches the upper limit current command value Iarmh*, switching to the second period is executed. As a result, gate signals G31 to G34 are generated such that switching elements Q32 and Q33 are turned ON and switching elements Q31 and Q34 are turned OFF.

The second period is kept until arm current Iarm lowers to the lower limit current command value Iarml*. When arm current Iarm lowers to the lower limit current command value Iarml*, switching to the first period is executed. As a result, gate signals G31 to G34 are generated such that switching elements Q31 and Q34 are turned ON and switching elements Q32 and Q33 are turned OFF.

In this way, the first period and the second period are alternately provided based on the comparison with the upper limit current command value Iarmh* and the lower limit current command value Iarml*, so that arm current Iarm follows the reference current command value Iarm* to be controlled in the range of Iarm*±ΔIarm*.

An operation command signal HYSon for hysteresis converter 300 is further input to hysteresis control unit 20. When the operation command signal HYSon is "1", hysteresis control unit 20 generates gate signals G31 to G34 in accordance with the arm current control described above. On the other hand, when the operation command signal HYSon is "0", hysteresis control unit 20 fixes all of gate signals G31 to G34 to "0" such that switching elements Q31 to Q34 are kept OFF.

Referring now to FIG. 4 to FIG. 8, control of power converter 100x and auxiliary converter 200x in steady operation of testing system 1a will be described.

Figure 4:
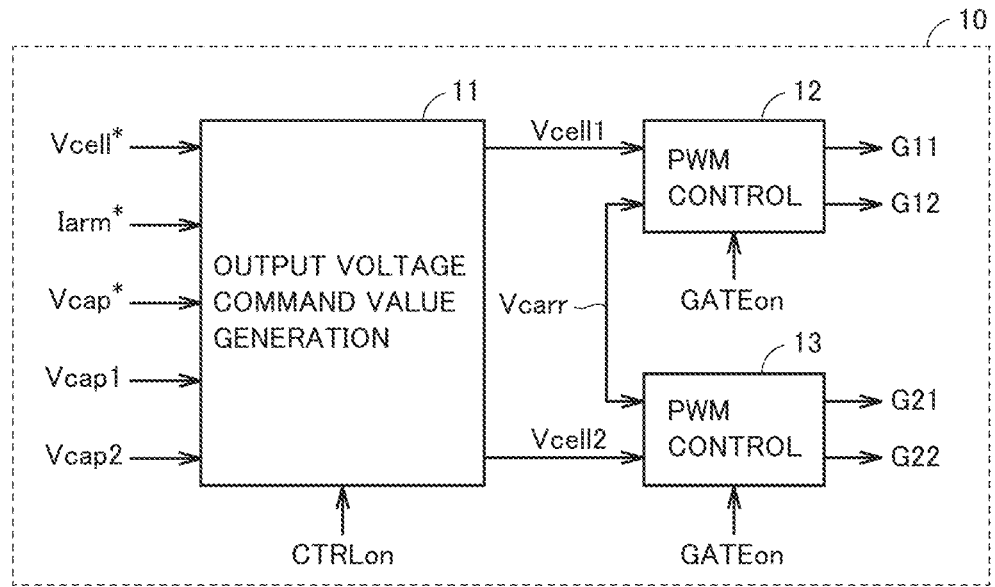
FIG. 4 is a block diagram illustrating a control configuration of a power converter and an auxiliary converter.

Referring to FIG. 4, control circuit 2 shown in FIG. 1 further includes a voltage control unit 10 to control power converter 100x and auxiliary converter 200x. Voltage control unit 10 includes an output voltage command value generator 11 and pulse width modulation (PWM) controllers 12 and 13.

Output voltage command value generator 11 outputs an output voltage command value Vcell1 for power converter 100x and an output voltage command value Vcell2 for auxiliary converter 200x. The output voltage command value Vcell1 corresponds to a command value of voltage at output terminal T11 with respect to a negative electrode voltage of power storage element C1 in power converter 100x. Similarly, the output voltage command value Vcell2 corresponds to a command value of voltage at output terminal T21 with respect to a negative electrode voltage of power storage element C2 in auxiliary converter 200x. The output voltage command value Vcell1 corresponds to "first output voltage command value", and the output voltage command value Vcell2 corresponds to "second output voltage command value".

Output voltage command value generator 11 calculates the output voltage command values Vcell1 and Vcell2, based on a reference output voltage command value Vcell*, the reference current command value Iarm*, a power storage element voltage command value Vcap*, the capacitor voltage Vcap1 detected by sensor VT1, and the capacitor voltage Vcap2 detected by sensor VT2. A voltage control execution command CTRLon for giving an instruction to execute and stop voltage control is further input to output voltage command value generator 11.

Here, the reference output voltage command value Vcell* is given by the following equation (2).

$$Vcell^* = Vdc^* + Vac^* \cdot \sin(\omega t + \varphi) \qquad (2)$$

In equation (2), for time t, ω is the angular frequency of an AC component and is common to equation (1). φ is the phase of the AC component and is set separately from θ in equation (1) and may be either φ≠θ or φ=θ. The reference output voltage command value Vcell* is also applied such that a DC voltage command value (Vdc*) and an AC voltage command value (Vac*·sin(ωt+φ)) are superimposed so that the output voltage in actual operation of each converter cell of the MMC can be simulated.

Figure 5:
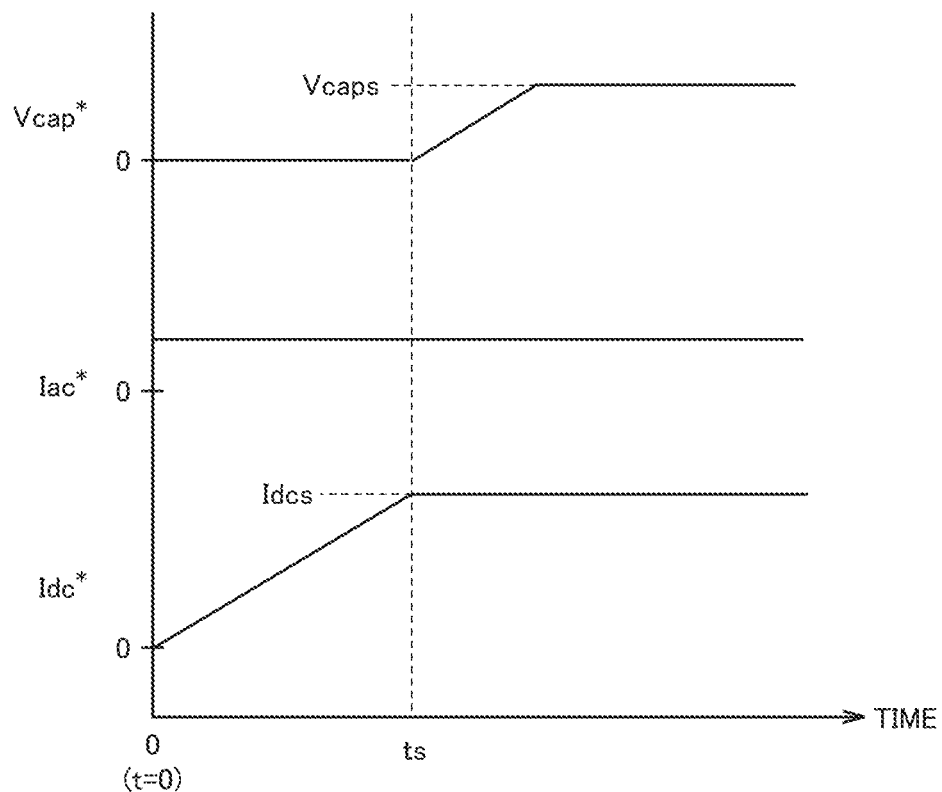
FIG. 5 is a conceptual diagram illustrating a setting example of a power storage element voltage command value and a reference current command value of arm current at the start of testing in the testing system.

FIG. 5 shows a setting example of the power storage element voltage command value Vcap* and the reference current command value Iarm* of the arm current at the start of testing in testing system 1a.

Referring to FIG. 5, in testing system 1a, at the start of supply of arm current Iarm in accordance with the reference current command value Iarm* from the hysteresis converter 300 (t=0), the DC component Idc* (absolute value) in equation (1) is set to 0 (|Idc*|=0) and, after t=0, gradually rises toward a setting value (Idcs) in a steady state. On the other hand, the AC component Iac* in equation (1) is basically kept to a certain value from the start of testing in testing system 1a.

Furthermore, with the phase θ=0 in equation (1), at t=0, hysteresis converter 300 can start operation from the state of the reference current command value Iarm*=0.

The power storage element voltage command value Vcap* is a command value for the capacitor voltages Vcap1 and Vcap2. The power storage element voltage command value Vcap* is basically set to Vcaps corresponding to the voltage of power storage elements C1 and C2 in actual operation (steady state) of each converter cell of the MMC. However, at the start of voltage control (time ts), power storage elements C1 and C2 are not charged, and therefore Vcap* is gradually raised from an initial value (for example, 0 or a minimal value). After Vcap*=Vcaps is attained, Vcap*=Vcaps is kept.

Figure 6:
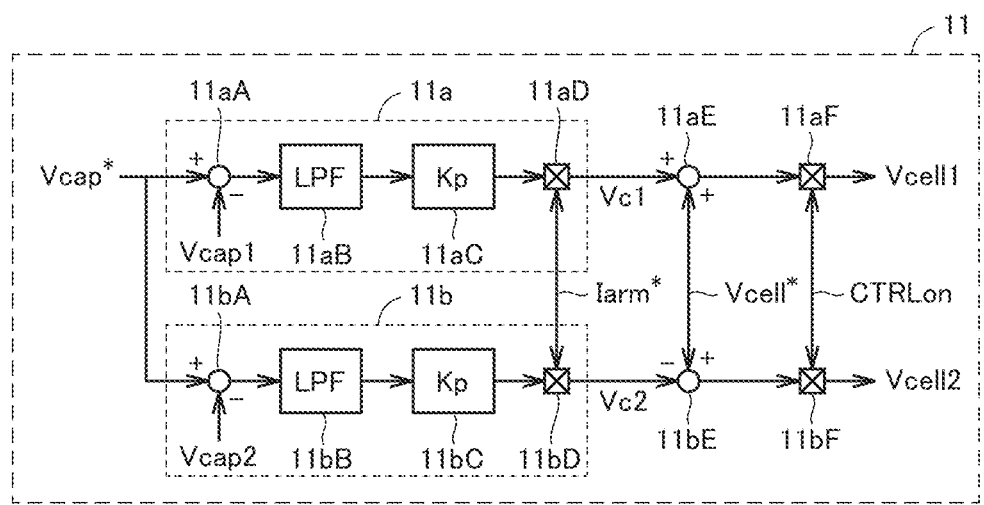
FIG. 6 is a block diagram illustrating a configuration example of an output voltage command value generator shown in in FIG. 4.

FIG. 6 is a block diagram illustrating a configuration example of output voltage command value generator 11.

Referring to FIG. 6, output voltage command value generator 11 includes a first computing unit 11a to generate a voltage control command value Vc1 for power converter 100x and a second computing unit 11b to calculate a voltage control command value Vc2 for auxiliary converter 200x.

First computing unit 11a includes a deviation computing unit 11aA, a lowpass filter 11aB, a proportional control unit 11aC, and a multiplication unit 11aD. Deviation computing unit 11aA calculates a voltage deviation of the capacitor voltage Vcap1 (the detection value by sensor VT1) from the power storage element voltage command value Vcap* (FIG. 5). The voltage deviation calculated by deviation computing unit 11aA is input to lowpass filter 11aB. The voltage deviation (Vcap*−Vcap1) corresponds to "first voltage deviation".

Proportional control unit 11aC outputs a value obtained by multiplying the voltage deviation having temporal change smoothed by lowpass filter 11aB by a predetermined control gain Kp (proportional gain). Multiplication unit 11aD generates a multiplication value of the output value from proportional control unit 11aC and the reference current command value Iarm* as the voltage control command value Vc1 for compensating for the voltage deviation (Vcap*−Vcap1). That is, the voltage control command value Vc1 corresponds to "first voltage control command value".

Second computing unit 11b includes a deviation computing unit 11bA, a lowpass filter 11bB, a proportional control unit 11bC, and a multiplication unit 11bD. Deviation computing unit 11bA calculates a voltage deviation of the capacitor voltage Vcap2 (the detection value by sensor VT2) from the power storage element voltage command value Vcap* (FIG. 5). The voltage deviation (Vcap*−Vcap2) corresponds to "second voltage deviation".

The voltage deviation calculated by deviation computing unit 11bA is input to lowpass filter 11bB, and proportional control unit 11bC outputs a value obtained by multiplying the voltage deviation output from lowpass filter 11bB by a control gain Kp (proportional gain). Multiplication unit 11bD generates a multiplication value of the output value from proportional control unit 11bC and the reference current command value Iarm* as a voltage control command value Vc2 for compensating for the voltage deviation (Vcap*−Vcap2). That is, the voltage control command value Vc2 corresponds to "second voltage control command value".

Output voltage command value generator 11 further includes an addition unit 11aE, a subtraction unit 11bE, and multiplication units 11aF and 11bF.

Addition unit 11aE outputs a value obtained by adding the reference output voltage command value Vcell* to the voltage control command value Vc1 by first computing unit 11a. Multiplication unit 11aF outputs a multiplication value of the output value from addition unit 11aE and the voltage control execution command CTRLon set to "0" or "1" as the output voltage command value Vcell1 of power converter 100x.

When the voltage control is ON, CTRLon="1" and Vcell1=Vcell*+Vc1 is set. That is, the output voltage command value Vcell1 is calculated such that a voltage in accordance with the reference output voltage command value Vcell* is output from output terminal T11 and power storage element C1 is charged and discharged in accordance with the power storage element voltage command value Vcap*, in power converter 100x.

On the other hand, subtraction unit 11bE outputs a value obtained by subtracting the voltage control command value Vc2 by second computing unit 11b from the reference output voltage command value Vcell*. Multiplication unit 11bF outputs a multiplication value of the output value from subtraction unit 11bE and the voltage control execution command CTRLon as the output voltage command value Vcell2 of auxiliary converter 200x.

Therefore, when CTRLon="1", Vcell2=Vcell*−Vc2 is set. As a result, the capacitor voltages Vcp1 and Vcp2 can be controlled by the same control block (FIG. 6), considering that arm current Iarm input to power converter 100x is output from auxiliary converter 200x. That is, the output voltage command value Vcell2 is controlled such that a voltage in accordance with the reference output voltage command value Vcell* is output from output terminal T21 and power storage element C2 is charged and discharged in accordance with the power storage element voltage command value Vcap*, in auxiliary converter 200x.

When CTRLon="0" is set in order to turn OFF the voltage control, Vcell1=Vcell2=0 is fixed.

Figure 7:
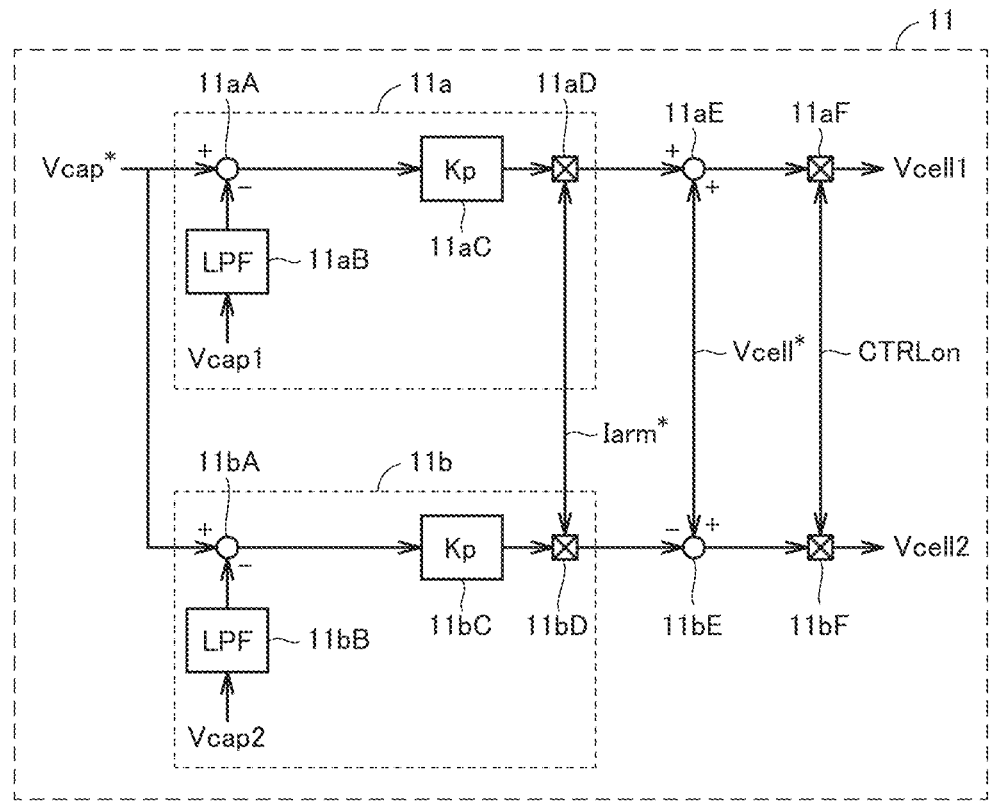
FIG. 7 is a block diagram illustrating another configuration example of the output voltage command value generator shown in FIG. 4.

FIG. 7 shows another configuration example of output voltage command value generator 11.

Referring to FIG. 7, first computing unit 11a and second computing unit 11b differ from the configuration example in FIG. 6 in arrangement of lowpass filters 11aB and 11bB. Specifically, lowpass filters 11aB and 11bB receive the capacitor voltages Vcap1 and Vcap2 (detection values of sensors VT1 and VT2), and deviation computing units 11aA and 11bA subtract the capacitor voltages Vcap1 and Vcap2 passed through the lowpass filters from the power storage element voltage command value Vcap* (FIG. 5) to calculate voltage deviations input to proportional control units 11aC and 11bC. With such a configuration, the output voltage command value Vcell1 (first output voltage command value) for power converter 100x and the output voltage command value Vcell2 (second output voltage command value) for auxiliary converter 200x can also be calculated in the same manner as in FIG. 6.

The control computation based on the voltage deviation can also be executed by another known control method such as proportional integral (PI) control, instead of proportional control units 11aC and 11bC in FIG. 6 and FIG. 7.

Referring to FIG. 4 again, PWM controller 12 for power converter 100x generates gate signals G11 and G12, based on the output voltage command value Vcell1 from output voltage command value generator 11 and a carrier voltage Vcarr that is a voltage value of a carrier signal. The carrier signal is formed of, for example, triangular waves or sawtooth waves having a certain frequency. Therefore, the carrier voltage Vcarr repeatedly rises and falls in accordance with the frequency of the carrier wave in a predetermined voltage range.

Figure 8:
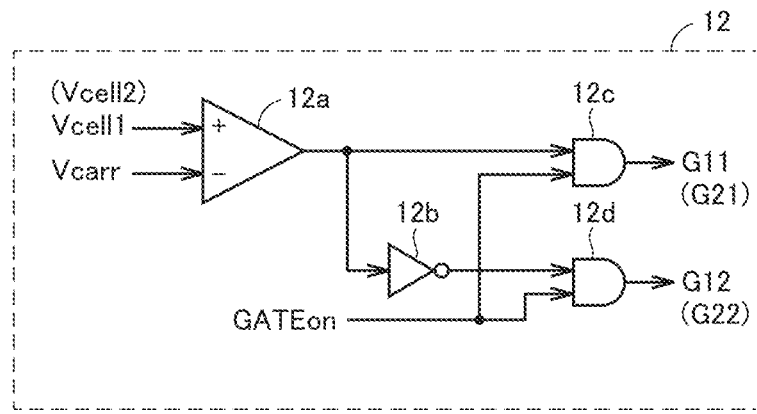
FIG. 8 is a circuit diagram illustrating a configuration example of a PWM controller shown in FIG. 7.

FIG. 8 is a circuit diagram illustrating a configuration example of the PWM controller.

Referring to FIG. 8, PWM controller 12 includes a voltage comparator 12a, a NOT circuit 12b, and AND circuits 12c and 12d. Voltage comparator 12a outputs a comparison result between the output voltage command value Vcell1 and the carrier voltage Vcarr. For example, when Vcell1>Vcarr, voltage comparator 12a outputs "1", and when Vcell1<Vcarr, voltage comparator 12a outputs "0". NOT circuit 12b inverts an output value of voltage comparator 12a.

AND circuit 12c receives an output value of voltage comparator 12a and a gate ON signal (GATEon). AND circuit 12d receives an output value of NOT circuit 12b and a gate ON signal (GATEon).

When GATEon="1", G11="1" and G12="0" are set in a period of Vcell1>Vcarr. Conversely, G11="0" and G12="1" are set in a period of Vcell1<Vcarr. In this way, gate signals G11 and G12 are set to mutually exclusive levels. In actuality, when the levels of gate signals G11 and G12 are switched, a period in which G11=G12="0" is provided as a dead time. It is noted that "set to mutually exclusive levels" in the present embodiment includes provision of a dead time at a time of level transition.

On the other hand, when GATEon="0", G11=G12="0" is fixed and switching elements Q11 and Q12 are kept OFF. As a result, the switching operation of power converter 100x can be stopped using the gate ON signal (GATEon).

PWM controller 13 for auxiliary converter 200x can also be configured in the same manner as in FIG. 8. Specifically, the output voltage command value Vcell2 is input to voltage comparator 12a, instead of the output voltage command value Vcell1, so that gate signal G21 can be output from AND circuit 12c, and gate signal G22 can be output from AND circuit 12d.

Power converter 100x and auxiliary converter 200x are controlled in accordance with FIG. 4 to FIG. 8 so that ON and OFF of switching elements Q11 and Q12 are controlled in power converter 100x such that the voltage at output terminal T11 follows the output voltage command value Vcell1 (first output voltage command value). As a result, power converter 100x can operate to output a voltage in accordance with the reference output voltage command value Vcell* from output terminal T11 in a state in which power storage element C1 is charged in accordance with the power storage element voltage command value Vcap* while arm current Iarm passes in accordance with the reference current command value Iarm*. As a result, in testing system 1a, power converter 100x can be tested such that actual operation of each converter cell of the MMC is simulated.

Similarly, in auxiliary converter 200x, ON and OFF of switching elements Q21 and Q22 are controlled such that the voltage at output terminal T21 follows the output voltage command value Vcell2 (second output voltage command value). As a result, auxiliary converter 200x operates to absorb voltage fluctuations that occur when power converter 100x operates as described above and prevent influence on the power supply side (hysteresis converter 300).

On the other hand, there are concerns in the following points, immediately after the start of testing in a period until a steady state is reached.

In a state in which power converter 100x outputs a voltage in accordance with the reference output voltage command value Vcell* from output terminal T11 under passage of current in accordance with the reference current command value Iarm* (Iarm*>0), a power Pcell* flowing into power converter 100x is represented by the following equation (3) as average power in one cycle of the fundamental wave in accordance with the angular frequency co.

$$Pcell^* = Vdc^* \times Idc^* + Vac^* \times Iac^* \times \cos(\varphi-\theta)/2 \quad (3)$$

Equation (3) is obtained by integrating instantaneous power represented by the product of Iarm* in equation (1) and Vcell* in equation (2), over one cycle of the fundamental wave, that is, a period of $\omega t=0$ to $2\pi$.

On the other hand, in auxiliary converter 200x, in a state in which a voltage in accordance with the reference output voltage command value Vcell* is output from output terminal T21 under passage of current (−Iarm*) in a direction opposite to that in power converter 100x, a power Paux* flowing into auxiliary converter 200x is represented by the following equation (4) as average power in one cycle of the fundamental wave in accordance with the angular frequency co.

$$Paux^* = -Vdc^* \times Idc^* - Vac^* \times Iac^* \times \cos(0-\theta)/2 \quad (4)$$

Here, power storage element C1 included in power converter 100x is charged and discharged by the instantaneous power flowing into power converter 100x. Similarly, power storage element C2 included in auxiliary converter 200x is charged and discharged by the instantaneous power flowing into auxiliary converter 200x. On the other hand, as can be understood from equation (3) and equation (4), the relation Paux*=−Pcell* holds between the average power Pcell* flowing into power converter 100x and the average power Paux* flowing into auxiliary converter 200x.

Because of this, for power storage elements C1 and C2, when one of the power storage elements is charged, the other power storage element is discharged. Therefore, when a state in which the capacitor voltages Vcap1 and Vcap2 of power storage elements C1 and C2 are stable, specifically, a state in which voltage fluctuations are zero before and after one cycle of the fundamental wave, is a steady state, it is understood that the condition for reaching the steady state is Pcell*=0. Pcell*=0 is solved for equation (3) to yield the following equation (5).

$$Vdc^* \times Idc^* = -Vac^* \times Iac^* \times \cos(\varphi-\theta)/2 \quad (5)$$

In a steady state, the reference output voltage command value Vcell* and the reference current command value Iarm* are applied such that equation (5) holds. Typically, the reference output voltage command value Vcell* (Vdc*, Vac*, φ) and the reference current command value Iarm* (Idc*, Iac*, θ) are set to correspond to the voltage output by one converter cell in the actual MMC and the current flowing through the converter cell. That is, the DC current command value Idc*=Idcs in a steady state illustrated in FIG. 5 is set such that the above equation (5) holds.

Here, as described with reference to FIG. 4, hysteresis converter 300 operates such that arm current Iarm is between the upper limit current command value Iarmh* (=Iarm*+ΔIarm) and the lower limit current command value Iarml* (=Iarm*−ΔIarm). Therefore, if the reference current command value Iarm* has the DC component Idc* at the start of operation, the actual arm current Iarm may fall significantly below the lower limit current command value Iarml* (in particular when Idc*>0) or may significantly exceed the upper limit current command value Iarmh* (in particular, when Idc*<0). As a result, an abrupt change of arm current Iarm may occur. Otherwise, a human-induced error in control may be triggered.

As described above, in the present embodiment, Idc* is set as shown in FIG. 5 and the phase θ=0 is set in equation (1), whereby supply of arm current by hysteresis converter 300 is started from the state of the reference current command value Iarm*=0, thereby preventing such an abrupt change of arm current Iarm.

As illustrated in FIG. 5, the DC component Idc* of the reference current command value Iarm* gradually rises over time from t=0. In doing so, when power converter 100x and auxiliary converter 200x perform switching operation in a period until Idc* rises to a region where the above equation (5) is satisfied, one of power storage elements C1 and C2 is charged and the other is discharged, causing unbalance between the capacitor voltages Vcap1 and Vcap2. If there is unbalance between the capacitor voltages Vcap1 and Vcap2, a voltage difference occurs between output terminals T11 and T21 at a timing when ON of switching element Q11 on the upper side in power converter 100x and ON of switching element Q21 on the upper side in auxiliary converter 200x overlap each other, and the voltage difference is superimposed on a voltage to be applied to reactor L1, which may influence the operation (current control) of hysteresis converter 300.

Therefore, in testing system 1a according to the present embodiment, a control process described below is executed in order to avoid the problem as described above and stabilize the operation in a transition period from the start of operation to a steady state.

Figure 9:
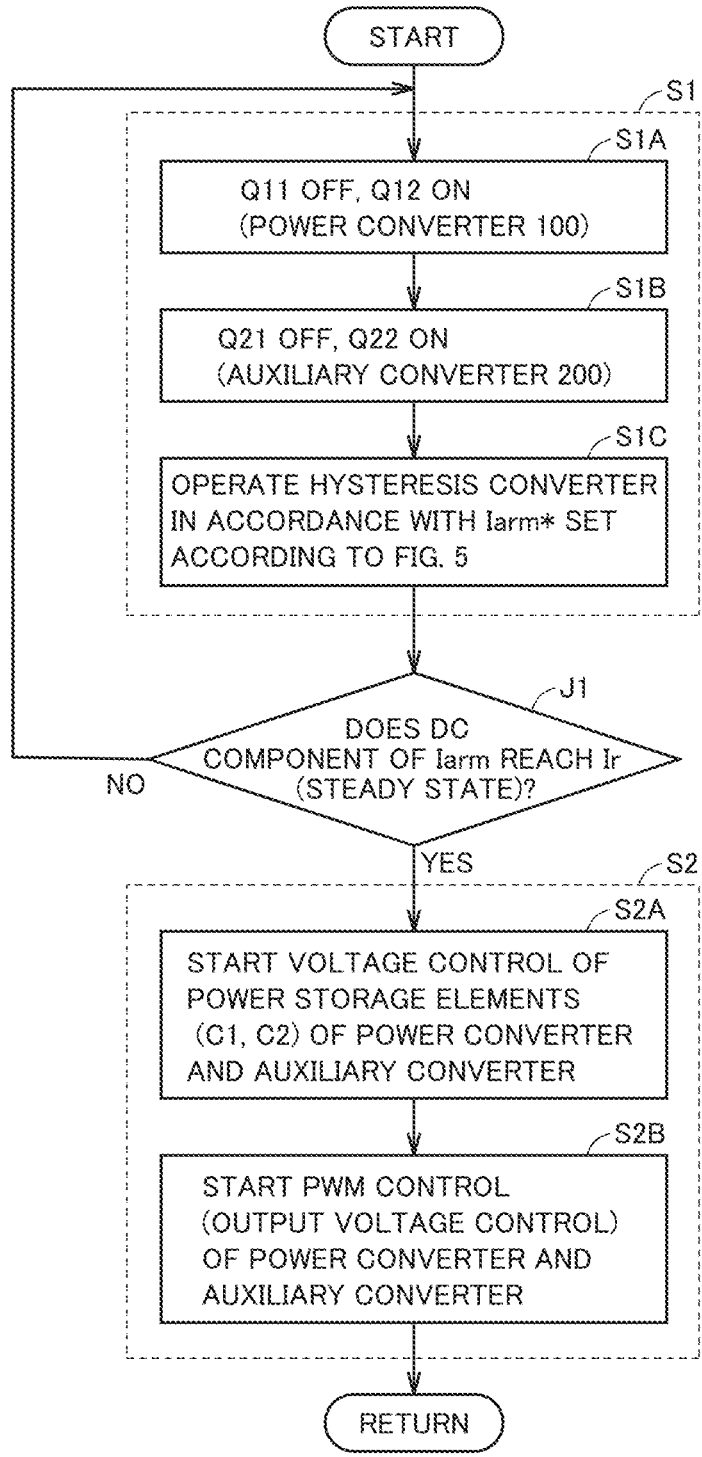
FIG. 9 is a flowchart illustrating a control process in testing according to a first embodiment in the testing system according to the present embodiment.

FIG. 9 is a flowchart illustrating a control process in testing according to the first embodiment in testing system 1a according to the present embodiment.

Referring to FIG. 9, when testing of power converter 100x in testing system 1a is started, control circuit 2 executes a circulation step S1 and a voltage control start step S2.

The circulation step S1 includes step S1A of fixing switching element Q11 (upper side) at OFF and fixing switching element Q12 (lower side) at ON in power converter 100x. The circulation step S1 further includes step S1B of fixing switching element Q21 (upper side) at OFF and fixing switching element Q22 (lower side) at ON in auxiliary converter 200x. For example, G11=G21="0" and G12=G22="1" can be set by setting CTRLon="0" in FIG. 6 or FIG. 7 and setting GATEon="1" in FIG. 8. Alternatively, aside from FIG. 4, FIG. 6 or FIG. 7, and FIG. 8, a configuration for directly setting G11=G21="0" and G12=G22="1" at the circulation step S1 may be provided.

The circulation step S1 further includes step S1C of operating hysteresis converter 300 in accordance with the reference current command value Iarm* set from Iac* and Idc* that make a transition from the start of operation (1=0) in accordance with FIG. 5. For example, at time t0, the process at step S1C is performed by changing HYSon from "0" to "1". Thereafter, HYSon="1" is kept throughout the testing of power converter 100x. Steps S1A to S1C are depicted to be successively performed as separate steps, for the sake of convenience, but actually performed in parallel.

At the circulation step S1 including steps S1A to S1C, arm current Iarm from hysteresis converter 300 circulates without charging power storage elements C1 and C2 through a path of terminal T31—output terminal T11—switching element Q12—line 110—switching element Q22—output terminal T21-terminal T32.

In execution of the circulation step S1, control circuit 2 executes a determination step J1 for transition to the voltage control start step S2. At the determination step J1, it is determined whether a DC component of arm current Iarm from hysteresis converter 300 rises to a determination value Ir. The determination value Ir is determined in advance to correspond to, for example, Idcs in FIG. 5.

At the determination step J1, the DC current command value Idc* (the DC component of the reference current command value Iarm*) set in accordance with FIG. 5 as a DC component of arm current Iarm can be compared with the determination value Ir. Alternatively, the detection value (sensor CT1) of arm current Iarm in a phase in which the AC component of the reference current command value Iarm* is zero may be compared with the determination value Ir.

Until the DC component of arm current Iarm reaches the determination value Ir, the determination at the determination step J1 is NO and the circulation step S1 is continued. On the other hand, control circuit 2 executes the voltage control start step S2 at a timing when the DC component of arm current Iarm reaches the determination value Ir (when the determination is YES at the determination step J1). For example, at a timing of time is in FIG. 5, the determination at the determination step J1 is YES. As described above, since HYSon="1" is kept, output of arm current Iarm in accordance with reference current command value Iarm* by hysteresis converter 300 is thereafter continued.

The voltage control start step S2 includes step S2A of starting voltage control of power storage elements C1 and C2 in power converter 100x and auxiliary converter 200x and step S2B of starting PWM control by power converter 100x and auxiliary converter 200x. For example, the process at steps S2A and S2B is performed by changing CTRLon in FIG. 6 or FIG. 7 from "0" to "1" with GATEon="1" in FIG. 8 being kept.

At this timing, since there is no voltage difference between the capacitor voltages Vcap1 and Vcap2 of power storage elements C1 and C2, current due to the voltage difference does not occur even when switching operation by the ON/OFF control of switching elements Q11 and Q12 in power converter 100x and switching operation by the ON/OFF control of switching elements Q21 and Q22 in auxiliary converter 200x are started.

In this state, output voltage command values Vcell1 and Vcell2 are set based on the voltage difference between the power storage element voltage command value Vcap* and the capacitor voltages Vcap1 and Vcap2 shown in FIG. 5, whereby power storage elements C1 and C2 are gradually charged. Furthermore, in a steady state after the determination is YES at the determination step J2, switching operation of power converter 100x is executed under passage of arm current Iarm in accordance with the reference current command value Iarm* in a steady state, in accordance with the reference output voltage command value Vcell* set to simulate the operation of the power converter 100x alone in actual operation of the MMC.

After the steady state, the output voltage of power converter 100x and the output voltage of auxiliary converter 200x may have different values in accordance with voltage control of power storage elements C1 and C2, due to sensor errors and occurrence of loss.

At the voltage control start step S2, step S2A and step S2B may be started stepwise. That is, only the voltage control of power storage elements C1 and C2 may be started (step S2A), and PWM control by power converter 100x and auxiliary converter 200x may be started (step S2B) after the capacitor voltages Vcap1 and Vcap2 are controlled to the power storage element voltage command value Vcap*. In this case, in a period until step S2B is executed, the reference output voltage command value Vcell* can be fixed to a certain value (for example, Vcell*=0).

As described above, in the testing system according to the first embodiment, voltage control of power storage elements C1 and C2 in accordance with the power storage element voltage command value Vcap* is started after the DC component of arm current Iarm rises to a steady state level. Because of this, the only active power that flows from the power output device (hysteresis converter) 300 into power converter 100x and auxiliary converter 200x is the power under voltage control of power storage elements C1 and C2, so that the voltages of power storage elements C1 and C2 are prevented from becoming unbalance abruptly, and circuit operation at the start of testing can be stabilized.

Furthermore, auxiliary converter 200x connected to power converter 100x to be tested through line 110 is arranged, and auxiliary converter 200x is operated in the same manner as power converter 100x, so that the difference between the output voltage of power converter 100x and the output voltage of auxiliary converter 200x is always substantially zero. As a result, the positive or negative pulse voltage produced by switching operation of hysteresis converter 300 is dominant in the voltage applied to reactor L1. Consequently, the operation of hysteresis converter 300 is stabilized to improve control stability of arm current Iarm flowing through power converter 100x (test target), so that the testing of power converter 100x can be executed even more stably.

Second Embodiment

In a second embodiment, a control process in which a charging step S3 of pre-charging power storage elements C1 and C2 is executed before the circulation step S1 will be described.

Figure 10:
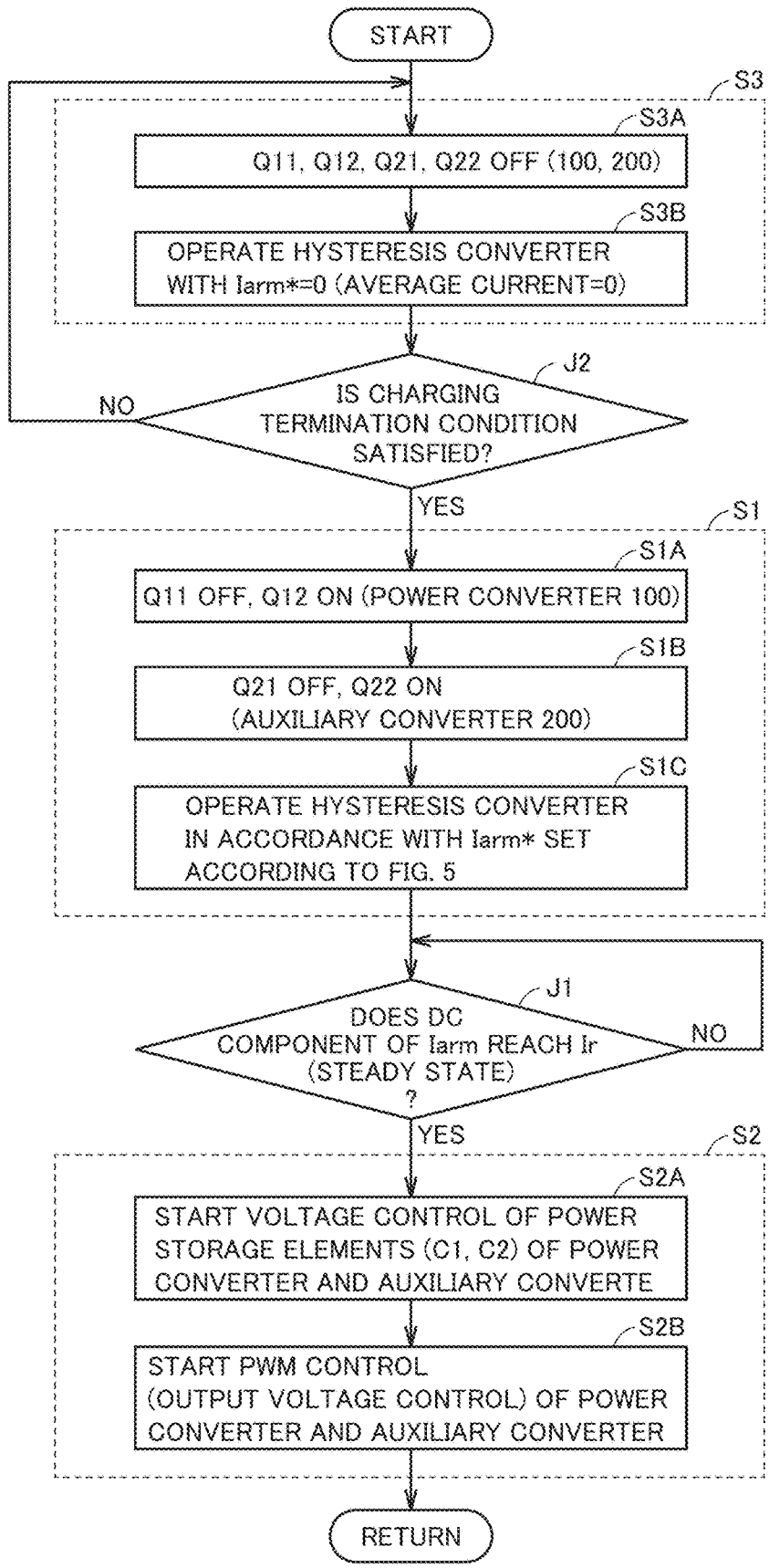
FIG. 10 is a flowchart illustrating a control process in testing according to a second embodiment.

FIG. 10 is a flowchart illustrating a control process in testing according to the second embodiment.

Referring to FIG. 10, the charging step S3 includes step S3A of turning OFF switching elements Q11 and Q12 in power converter 100x and switching elements Q21 and Q22 in auxiliary converter 200x. For example, the process at step S3A can be executed by fixing GATEon="0" in FIG. 8.

The charging step S3 further includes step S3B of operating hysteresis converter 300 with the reference current command value Iarm*=0. Therefore, at the charging step S3, hysteresis converter 300 generates arm current Iarm such that the rise and the fall are repeated between the upper limit current command value Iarmh*=ΔIarm and the lower limit current command value Iarml*=−ΔIarm.

Figure 11:
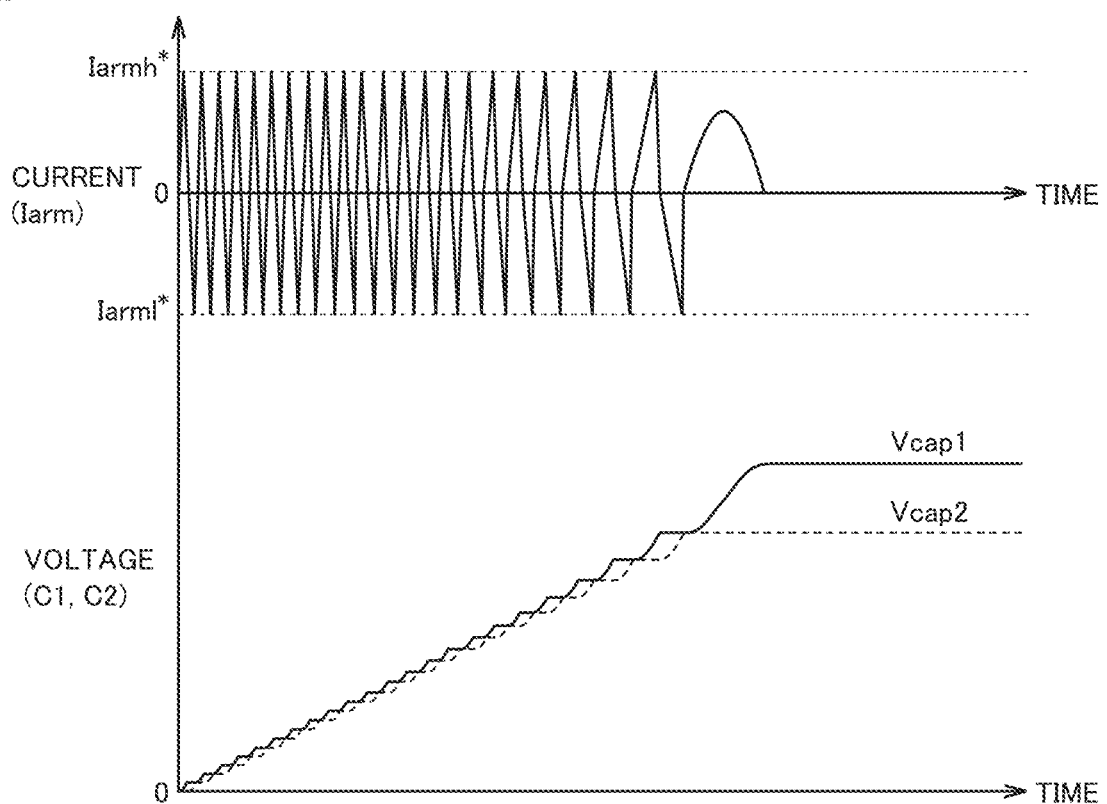
FIG. 11 is an exemplary operation waveform diagram in a charging step according to the second embodiment.

FIG. 11 shows an exemplary operation waveform diagram at the charging step S3.

Referring to FIG. 11, the difference (absolute value) between the upper limit current command value Iarmh* and the reference current command value Iarm* (=0) is equal to the difference (absolute value) between the lower limit current command value Iarml* and the reference current command value Iarm* (=0). Therefore, since the upper limit current command value Iarmh* and the lower limit current command value Iarml* are symmetric in sign with respect to zero, arm current Iarm is controlled to AC current symmetric in sign with respect to zero (average value=0) in which a period of Iarm>0 and a period of Iarm<0 periodically appear.

Figure 12:
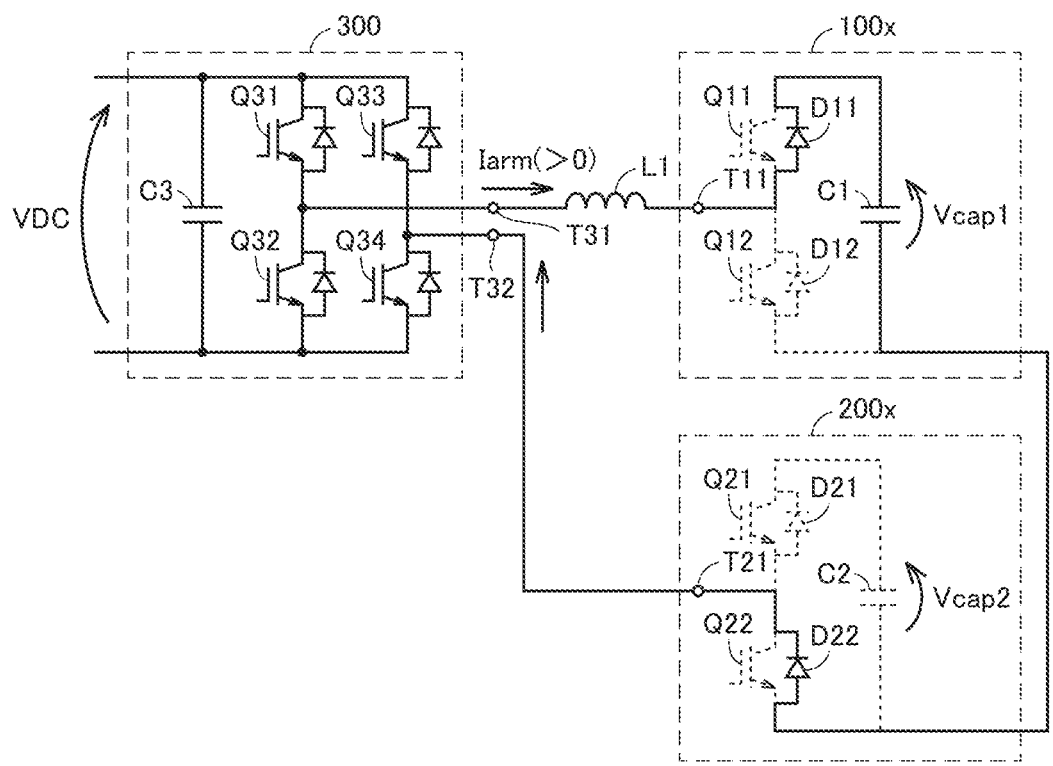
FIG. 12 is a first circuit diagram illustrating operation of the power converter and the auxiliary converter in the charging step.

FIG. 12 shows a circuit diagram illustrating the operation of power converter 100x and auxiliary converter 200x in a period of Iarm>0.

Referring to FIG. 12, at the charging step S3, since switching elements Q11, Q12, Q21, and Q22 are fixed at OFF, the path of arm current Iarm is ensured by the antiparallel diodes of the switching elements.

In a period of Iarm>0, arm current Iarm flowing from terminal T31 toward output terminal T11 flows from output terminal T21 to terminal T32 through a path of antiparallel diode D11 of switching element Q11—power storage element C1—antiparallel diode D22 of switching element Q22. As a result, power storage element C1 is charged by arm current Iarm generated depending on the voltage difference (VDC−Vcap1) between the voltage (VDC) of power storage element C3 of hysteresis converter 300 and the capacitor voltage Vcap1 of power storage element C1.

Figure 13:
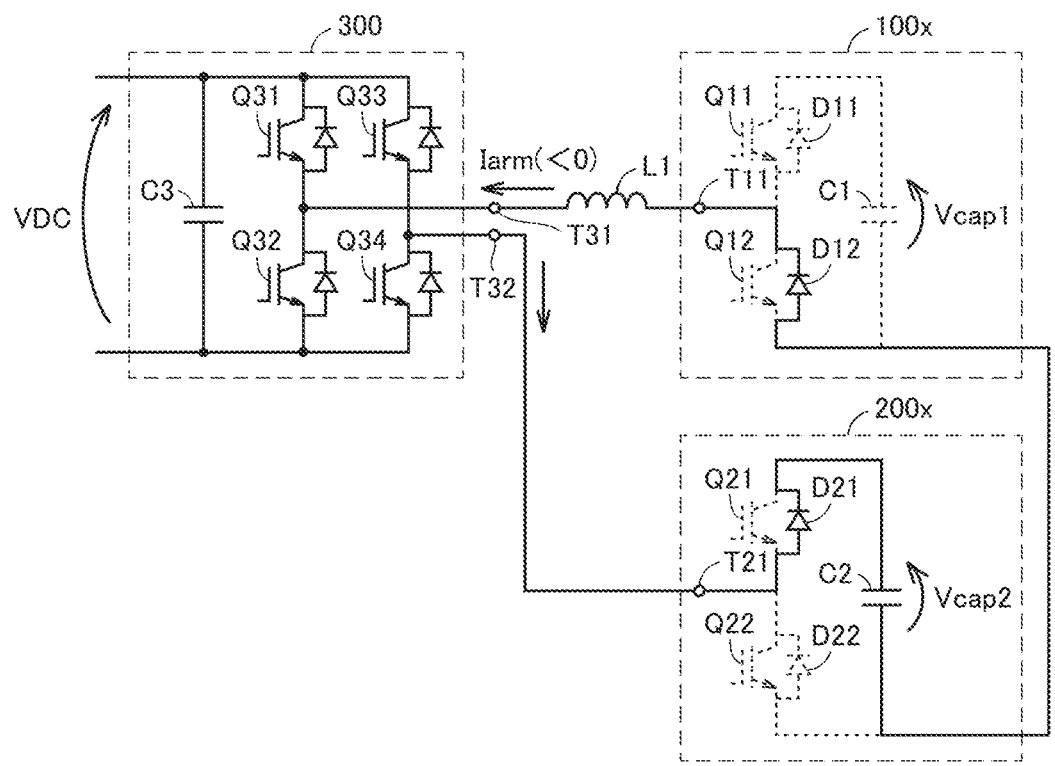
FIG. 13 is a second circuit diagram illustrating operation of the power converter and the auxiliary converter in the charging step.

FIG. 13 shows a circuit diagram illustrating the operation of power converter 100x and auxiliary converter 200x in a period of Iarm<0.

In a period of Iarm<0, arm current Iarm flowing from terminal T32 toward output terminal T21 flows from output terminal T11 to terminal T31 via antiparallel diode D21 of switching element Q21—power storage element C2—antiparallel diode D12 of switching element Q12. As a result, power storage element C2 is charged by arm current Iarm generated depending on the voltage difference (VDC−Vcap2) between the voltage (VDC) of power storage element C3 and the capacitor voltage Vcap2 of power storage element C2.

Referring to FIG. 11 again, since the period of Iarm>0 and the period of Iarm<0 alternately appear, power storage element C1 and power storage element C2 are alternately charged substantially uniformly. In doing so, the inclination of arm current is proportional to (VDC−Vcap1)/L1 in a period in which arm current Iarm rises, and the inclination of arm current is proportional to −(VDC−Vcap2)/L1 in a period in which arm current Iarm lowers.

Therefore, with the capacitor voltages Vcap1 and Vcap2 rising, the inclination of arm current Iarm gradually decreases and the cycle of AC current also gradually increases. Then, when the capacitor voltage Vcap1 or Vcap2 rises to the voltage (VDC) of power storage element C3 of hysteresis converter 300, arm current Iarm becomes zero.

When this state is reached, hysteresis converter 300 is no longer able to charge power storage elements C1 and C2 at the charging step S3 because switching elements Q31 to Q34 are not switched. In the example in FIG. 11, when Vcap1=VDC is reached, charging of power storage elements C1 and C2 is terminated. At this point of time, the switching operation of hysteresis converter 300 is stopped in a state in which energy is stored in reactor L1. Because of this, a voltage difference corresponding to the stored energy occurs between the capacitor voltages Vcap1 and Vcap2.

Referring to FIG. 10 again, in execution of the charging step S3, control circuit 2 executes the determination step J2 for a termination condition of the charging step. For example, when the capacitor voltages Vcap1 and Vcap2 rise to the vicinity of the voltage (VDC) of power storage element C3 or when a predetermined time passes since the start of the charging step S3, the determination can be set to YES at the determination step J2. On the other hand, the determination is NO at the determination step J2 until the rise of the capacitor voltages Vcap1 and Vcap2 or the elapse of a predetermined time is detected.

Alternatively, at the determination step J2, extinction of arm current Iarm (Iarm=0) based on the termination of charging of power storage elements C1 and C2 shown in FIG. 11 may be detected. For example, when a state of |Iarm|<ε (ε≈0) continues for a predetermined time, control circuit 2 can detect Iarm=0 and the determination at the determination step J2 can be set to YES. On the other hand, the determination at the determination step J2 is NO until Iarm=0 is detected.

While the determination at the determination step J2 is NO, a transition to the circulation step S1 is awaited and the charging step S3 is continued. On the other hand, when the determination at the determination step J2 is YES, control circuit 2 executes the circulation step S1, the determination step J1, and the voltage control start step S2 similar to those in the first embodiment (FIG. 9). That is, the operation of testing system 1a after the determination at the determination step J2 is YES is similar to that in the first embodiment and a detailed description thereof will not be repeated. In the second embodiment, a modification is necessary such that the power storage element voltage command value Vcap* shown in FIG. 5 is set to a value equivalent to DC voltage VDC, at time is when voltage control is started.

As described above, in the control process in testing in the testing system according to the second embodiment, since the charging step S3 is added, power storage elements C1 and C2 are charged to a substantially uniform voltage in advance when the process proceeds to the voltage control start step S2 after the circulation step S1 is finished. Accordingly, while unbalance between the capacitor voltages Vcap1 and Vcap2 of power storage elements C1 and C2 is prevented, the time taken for the capacitor voltages Vcap1 and Vcap2 of power storage elements C1 and C2 to reach the reference output voltage command value Vcell* can be reduced after the start of voltage control.

In particular, in the voltage control after the voltage control start step S2 (FIG. 4), power storage elements C1 and C2 are gradually charged while charge and discharge are repeated. It is therefore understood that, with the voltage control alone, it takes some time to raise the capacitor voltages Vcap1 and Vcap2 to the reference output voltage command value Vcell* from a state of the capacitor voltage Vcap1=Vcap2=0.

In contrast, in the charging step S3 described above, power storage elements C1 and C2 are charged without a period in which power storage elements C1 and C2 are discharged. Therefore, it is understood that since the process can pass through the charging step S3, the time taken to charge power storage elements C1 and C2 can be reduced compared with charging with the voltage control alone. In this way, in the process control in testing according to the second embodiment, testing can be performed more efficiently because the time from the start of testing to reach a steady state is reduced.

Third Embodiment

In a third embodiment, a modification of the charging step S3 described in the second embodiment will be described.

As described with reference to FIG. 11, after the charging step S3 is finished in the second embodiment, a voltage difference equivalent to the stored energy in reactor L1 occurs between the capacitor voltages Vcap1 and Vcap2 of power storage elements C1 and C2. In the third embodiment, the charging step S3 for suppressing such a voltage difference will be described.

Figure 14:
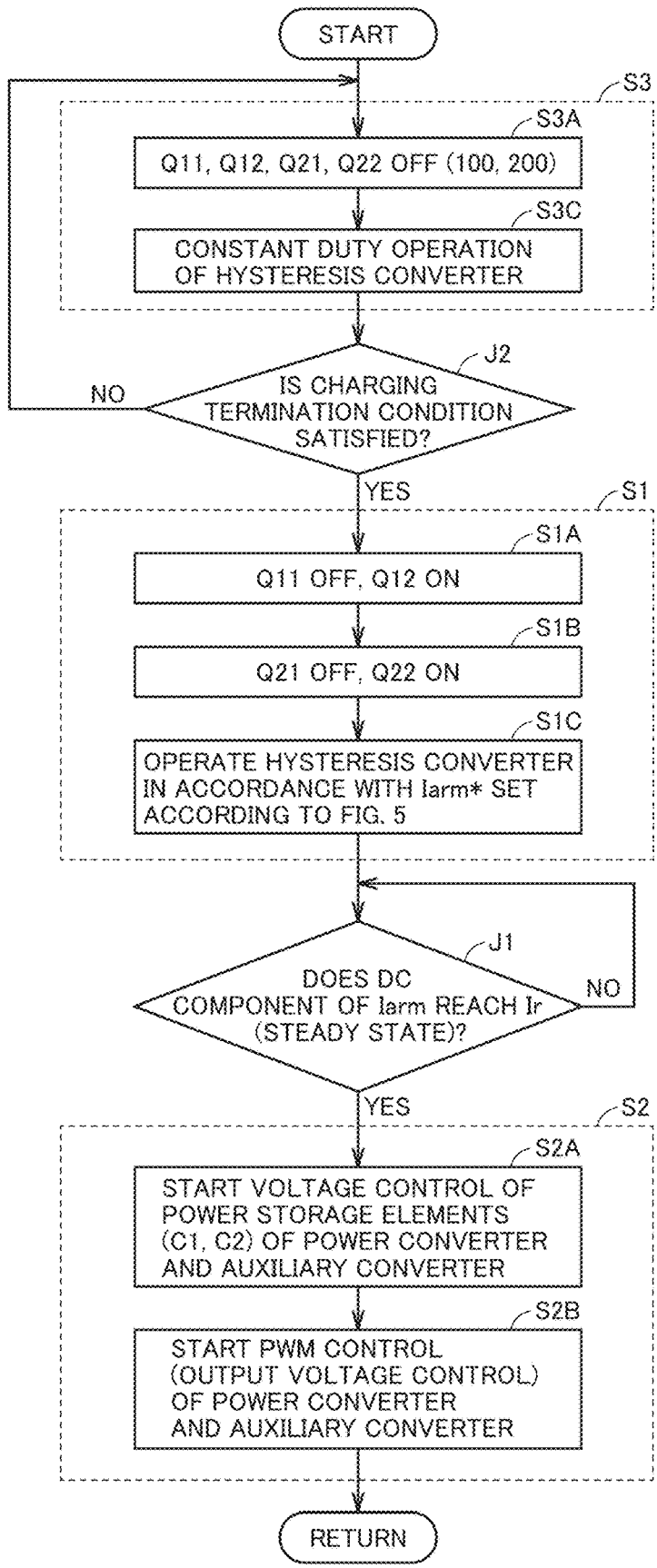
FIG. 14 is a flowchart illustrating a control process in testing according to a third embodiment.

FIG. 14 is a flowchart illustrating a control process in testing according to the third embodiment.

Referring to FIG. 14, in the third embodiment, control circuit 2 also executes the charging step S3 prior to the circulation step S1 illustrated in FIG. 9. The charging step S3 includes step S3A similar to that in FIG. 10 and step S3C of operating hysteresis converter 300 with a constant duty. That is, at the charging step S3 according to the third embodiment, step S3C is executed instead of step S3B of operating hysteresis converter 300 with the reference current command value Iarm*=0.

At step S3C, control circuit 2 controls hysteresis converter 300 such that a first period in which switching elements Q31 and Q34 are turned ON and switching elements Q32 and Q33 are turned OFF and a second period in which switching elements Q32 and Q33 are turned ON and switching elements Q31 and Q34 are turned ON in certain switching cycles are alternately provided in accordance with a certain ratio of period lengths (duty) in certain cycles.

For example, the ratio of the length T1 of the first period to the length T2 of the second period (T1:T2) is set to a certain value in accordance with the ratio of capacitances of power storage elements C1 and C2 (C1:C2) (T1:T2=C1:C2). For example, the process at step S3C can be performed by preliminarily generating a signal pattern specific to the charging step S3 of gate signals G11, G21, G22, and G22 for turning ON and OFF of switching elements Q11, Q21, Q22, and Q22 according to a switching pattern in accordance with the constant duty.

Figure 15:
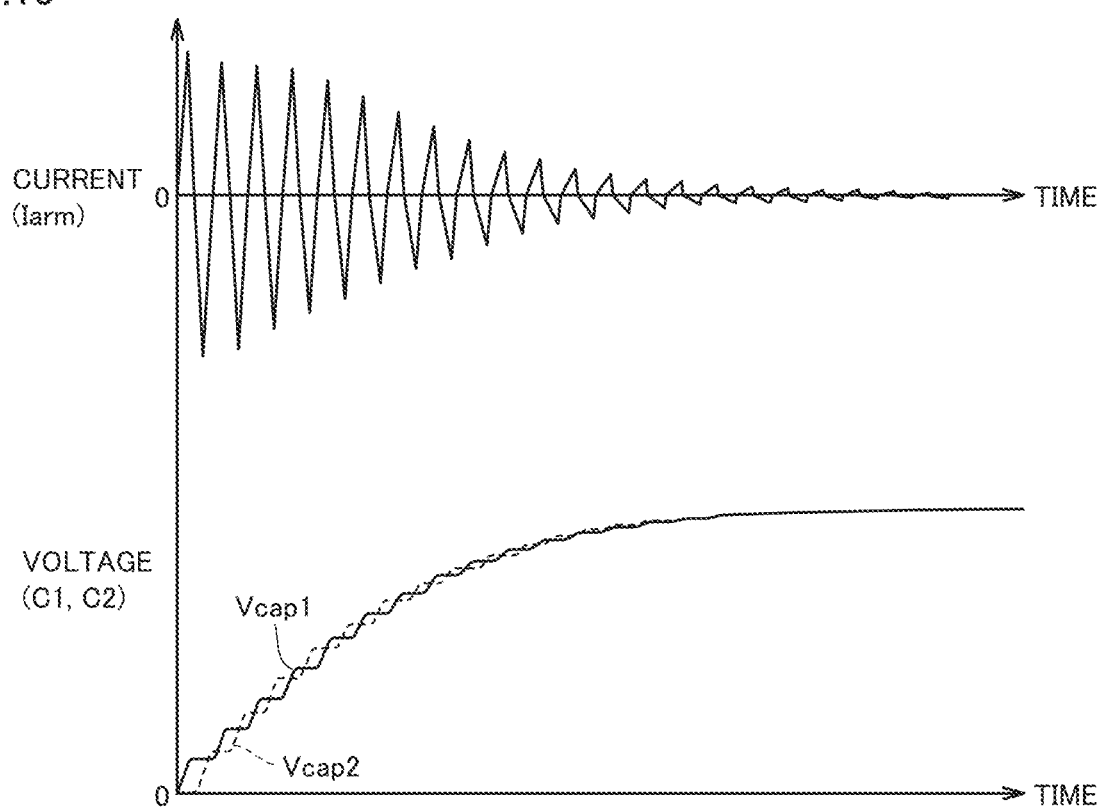
FIG. 15 is an exemplary operation waveform diagram in the charging step according to the third embodiment.

FIG. 15 shows an exemplary operation waveform diagram at the charging step S3 according to the third embodiment.

Referring to FIG. 15, when C1=C2, T1:T2=1:1, that is, a duty of 50(%) is set. As a result, the first period in which hysteresis converter 300 outputs a positive voltage pulse between terminal T31 and terminal T32 to raise arm current Iarm (Q31 and Q34 are turned ON and Q32 and Q33 are turned OFF) and a second period in which hysteresis converter 300 outputs a negative voltage pulse between terminal T31 and terminal T32 to lower arm current Iarm (Q32 and Q33 are turned ON and Q31 and Q34 are turned OFF) are alternately provided in time lengths of 1:1.

In the operation example in FIG. 15, initial phase adjustment is performed to adjust the length of the initial first period (the length half the normal one) such that arm current Iarm is symmetric in sign, from arm current Iarm=0 (t=0). Consequently, arm current Iarm attains a waveform symmetric in sign at the start of testing (t=0).

As a result, a period of arm current Iarm>0 in which power storage element C1 is charged through the current path in FIG. 12 and the capacitor voltage Vcap1 rises and a period of arm current Iarm<0 in which power storage element C2 is charged through the current path in FIG. 13 and the capacitor voltage Vcap2 rises are alternately provided in equal time lengths. Consequently, power storage elements C1 and C2 are alternately charged equally.

Arm current Iarm gradually attenuates with the rise of the capacitor voltages Vcap1 and Vcap2 because hysteresis converter 300 performs switching operation with a fixed switching frequency of switching elements Q31 to Q34. Therefore, at last, the difference between the voltage VDC (FIG. 12, FIG. 13) of power storage element C3 and the capacitor voltages Vcap1 and Vcap2 disappears, and the stored energy in reactor L1 decreases when charging is terminated. Consequently, the voltage difference between the capacitor voltages Vcap1 and Vcap2 at the end of charging can be significantly reduced compared with the second embodiment (FIG. 11).

Figure 16:
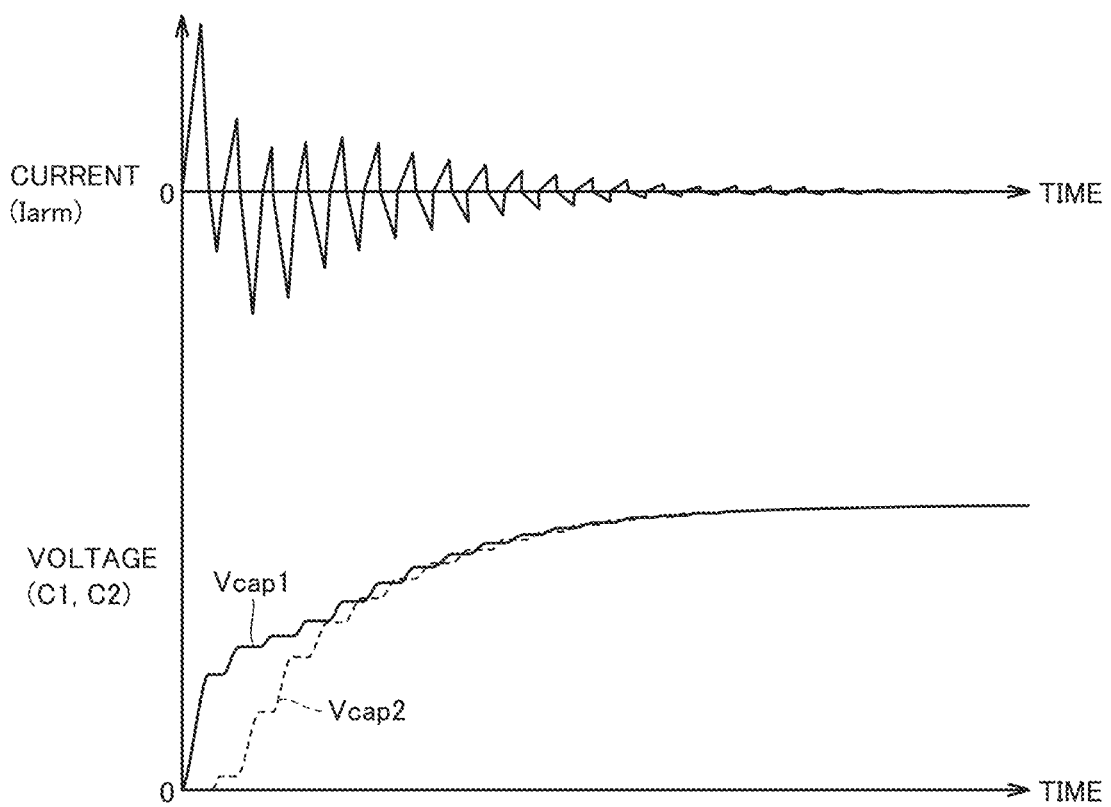
FIG. 16 is another exemplary operation waveform diagram in the charging step according to the third embodiment.

FIG. 16 shows an operation waveform diagram of another example in which the charging step is executed without performing the initial phase adjustment illustrated in FIG. 15.

Referring to FIG. 16, when the initial phase adjustment is not executed, arm current Iarm is not symmetric in sign immediately after the start of the charging step S3, and therefore charging proceeds disproportionately in one of power storage element C1 or C2. As a result, unbalance is caused to some extent between the capacitor voltages Vcap1 and Vcap2.

However, since hysteresis converter 300 is subjected to constant duty control, arm current Iarm attenuates with the progress of charging of power storage elements C1 and C2. Accordingly, the voltage applied to reactor L1 decreases, and the voltage difference between the capacitor voltages Vcap1 and Vcap2 also gradually decreases.

Consequently, at the end of charging in the charging step S3, there is no significant difference in voltage and current behavior between FIG. 15 with the initial phase adjustment and FIG. 16 with no initial phase adjustment. That is, it is understood that the initial phase adjustment in starting the constant duty control is not essential at the charging step according to the third embodiment.

Referring to FIG. 14 again, control circuit 2 executes the determination step J2 for termination of the charging step when the charging step S3 is executed. As shown in FIG. 15 and FIG. 16, at the charging step S3 in the third embodiment, extinction of arm current Iarm (Iarm=0) is also detected at the end of charging of power storage elements C1 and C2. The determination step J2 in FIG. 14 therefore may also be a process similar to the determination step J2 in FIG. 12. In the third embodiment, a modification is also necessary such that the power storage element voltage command value Vcap* shown in FIG. 5 is set to a value equivalent to the DC voltage VDC, at time is when voltage control is started.

Also in FIG. 14, the charging step S3 is continued while the determination at the determination step J2 is NO, but when the determination at the determination step J2 is YES, control circuit 2 executes the circulation step S1, the determination step J1, and the voltage control start step S2 similar to those in the first embodiment (FIG. 9). In FIG. 14 (third embodiment), the operation of testing system 1a after the determination at the determination step J2 is YES is similar to that in the first embodiment and a detailed description thereof will not be repeated.

As described above, in the control process in testing with the testing system according to the third embodiment, in addition to the effect described in the second embodiment, unbalance between the capacitor voltages Vcap1 and Vcap2 can be suppressed at the end of charging of power storage elements C1 and C2 at the charging step S3. Consequently, the operation of voltage control start can be further stabilized.

Finally, modifications of the configuration of testing system 1a shown in FIG. 1 will be described.

Figure 17:
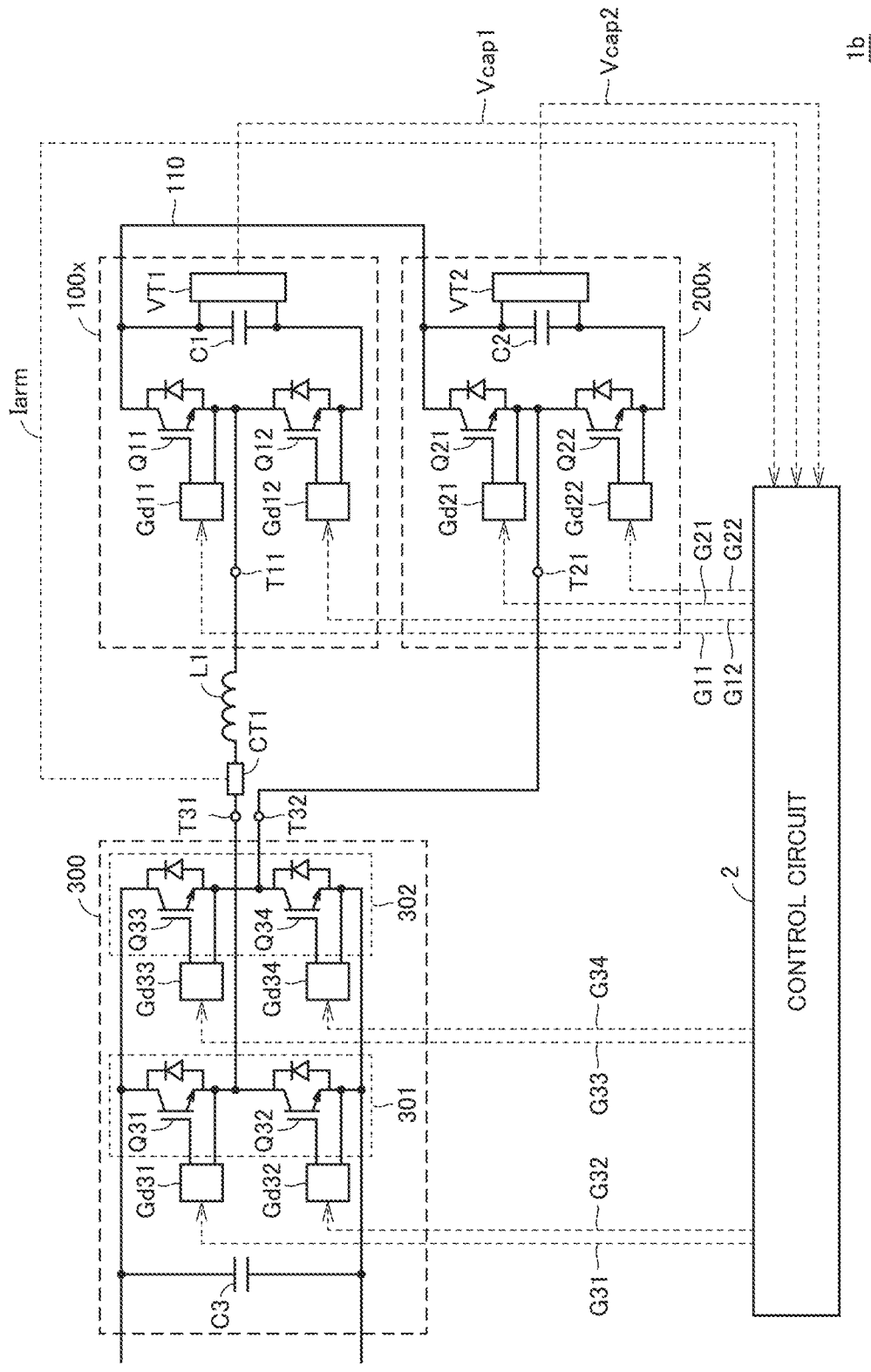
FIG. 17 is a circuit diagram illustrating a first modification of the configuration of the testing system including the testing device according to the present embodiment.

FIG. 17 is a circuit diagram illustrating a first modification of the configuration of the testing system including the testing device according to the present embodiment.

Referring to FIG. 17, in a testing system 1b according to the first modification, line 110 is arranged to connect the positive electrodes of power storage element C1 of power converter 100x and power storage element C2 of auxiliary converter 200x. This configuration can also ensure a path of arm current Iarm, including power converter 100x to be tested and auxiliary converter 200x. The configuration of the other part of testing system 1b is similar to that of testing system 1a (FIG. 1) and a detailed description will not be repeated.

In testing system 1b in FIG. 17, the circulation step S1 can be implemented by turning ON switching element Q11 and turning OFF switching element Q12 in power converter 100x, and turning ON switching element Q21 and turning OFF switching element Q22 in auxiliary converter 200x. At the charging step S3 in the second and third embodiments, power storage element C2 is charged in a period of Iarm>0 and power storage element C1 is charged in a period of Iarm<0 by turning OFF switching elements Q11 and Q12 in power converter 100x and turning OFF switching elements Q21 and Q22 in auxiliary converter 200x.

Figure 18:
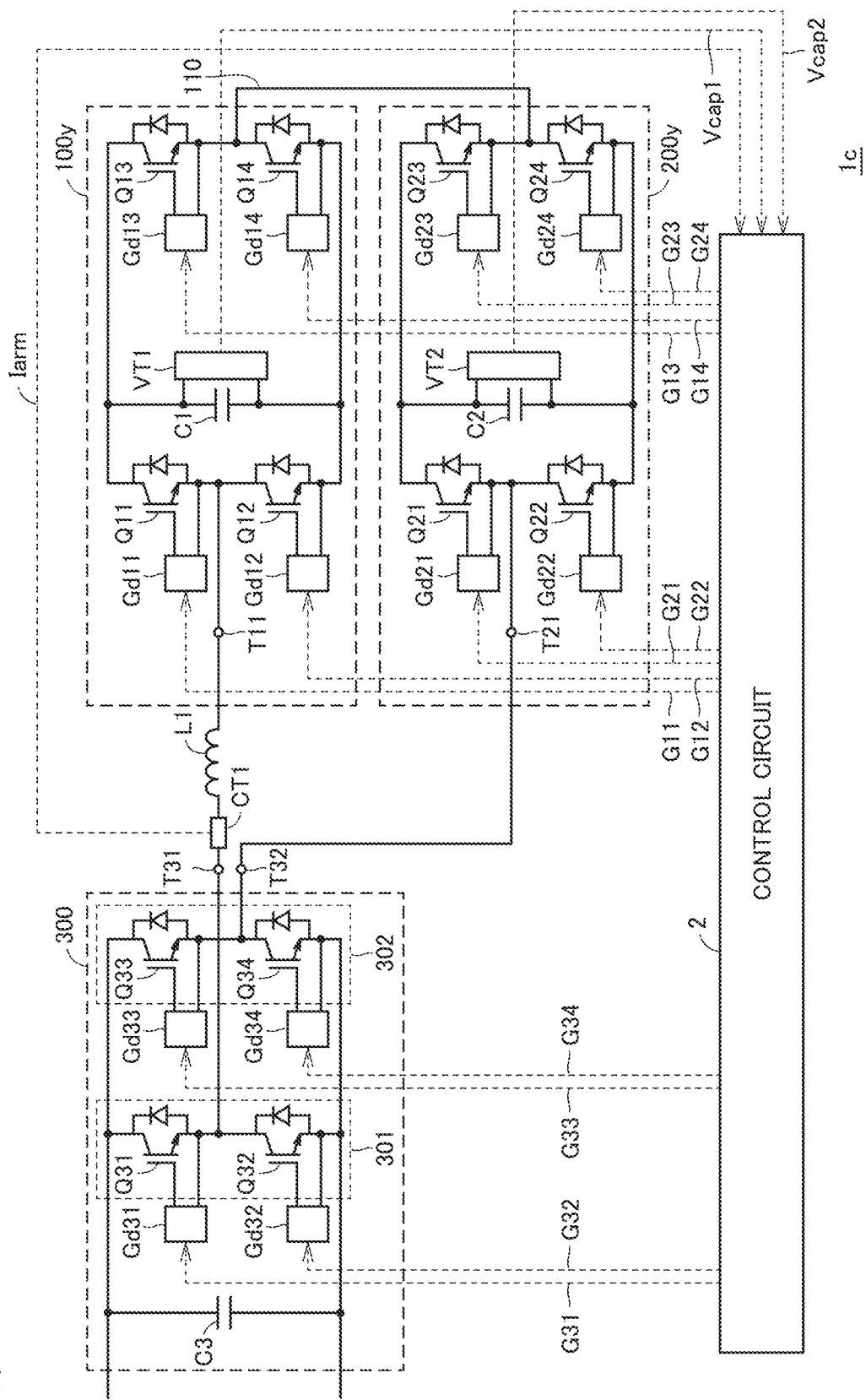
FIG. 18 is a circuit diagram illustrating a second modification of the configuration of the testing system including the testing device according to the present embodiment.

Alternatively, as shown in FIG. 18, the configuration of the power converter to be tested and the auxiliary converter is also not limited to the example in FIG. 1.

FIG. 18 is a circuit diagram illustrating a second modification of the configuration of the testing system including the testing device according to the present embodiment.

Referring to FIG. 18, a testing system 1c according to the second modification differs in that it includes a power converter 100y and an auxiliary converter 200y instead of power converter 100x and auxiliary converter 200x in the half-bridge construction shown in FIG. 1 and FIG. 17.

Power converter 100y to be tested further includes switching elements Q13 and Q14 connected in series, in addition to the configuration of power converter 100x (FIG. 1). The series connection of switching elements Q13 and Q14 is connected in parallel with power storage element C1 and the series connection of switching elements Q11 and Q12. Power converter 100y has a full-bridge construction. Switching elements Q13 and Q14 are driven ON and OFF by gate drive circuits Gd13 and Gd14, in response to gate signals G13 and G14 from control circuit 2. Switching elements Q13 and Q14 correspond to "third and fourth main switching elements".

Similarly, auxiliary converter 200y further includes switching elements Q23 and Q24 connected in series, in addition to the configuration of auxiliary converter 200x (FIG. 1). The series connection of switching elements Q23 and Q24 is connected in parallel with power storage element C2 and the series connection of switching elements Q21 and Q22. Switching element Q23 and Q24 are driven ON and OFF by gate drive circuits Gd23 and Gd24, in response to gate signals G23 and G24 from control circuit 2. Switching elements Q23 and Q24 correspond to "third and fourth auxiliary switching elements".

Line 110 is arranged to connect the connection node of switching elements Q13 and Q14 to the connection node of switching elements Q23 and Q24 to ensure a path of arm current Iarm, including power converter 100y to be tested and auxiliary converter 200y. The configuration of the other part of testing system 1c is similar to that of testing system 1a (FIG. 1) and a detailed description will not be repeated.

In testing system 1c in FIG. 18, the circulation step S1 can be implemented by turning ON switching elements Q12 and Q14 and turning OFF switching elements Q11 and Q13 in power converter 100y and turning ON switching elements Q22 and Q24 and turning OFF switching elements Q21 and Q23 in auxiliary converter 200y. At the charging step S3 in the second and third embodiments, power storage elements C1 and C2 connected in series can be charged by full-wave rectification of arm current Iarm, throughout the period of Iarm>0 and the period of Iarm<0, by turning OFF switching elements Q11 to Q14 in power converter 100x and turning OFF switching elements Q21 to Q24 in auxiliary converter 200y.

In each of testing systems 1b and 1c shown in FIG. 17 and FIG. 18, auxiliary converter 200x, 200y connected to power converter 100x, 100y to be tested through line 110 is arranged, and auxiliary converter 200x, 200y is operated in the same manner as power converter 100x, 100y, whereby the difference between the output voltage of power converter 100x, 100y and the output voltage of auxiliary converter 200x, 200y can be always substantially zero. Consequently, the operation of hysteresis converter 300 can be stabilized, and the control stability of arm current Iarm flowing through power converter 100x, 100y (test target) can be improved, thereby stabilizing the operation of testing system 1b, 1c, in the same manner as described in the first embodiment.

In this way, in the testing system according to the present embodiment, each of the power converter to be tested and the auxiliary converter includes a series connection of switching elements and a power storage element connected in parallel with the series connection and may have any circuit configuration as long as a current path that does not include the power storage element can be formed at the circulation step.

A configuration including hysteresis converter 300 and reactor L1 has been described as an example of "power output circuit" for outputting arm current Iarm (test current) that simulates actual operation of power converter 100x to be tested. However, the "power output circuit" may have any configuration that has a function of outputting arm current Iarm in accordance with the reference current command value Iarm*.

For example, the "current output circuit" may be formed using a current source with high control responsivity, instead of hysteresis converter 300 and reactor L1. Also in this case, a charging current path for power storage elements C1 and C2 with antiparallel diodes can be formed by fixing the switching elements at OFF in power converter 100x, 100y and auxiliary converter 200x, 200y in a state in which the current source outputs AC current symmetric in sign with respect to zero. That is, the charging step S3 in the second and third embodiments can be implemented similarly.

Embodiments disclosed here should be understood as being illustrative rather than being limitative in all respects. The scope of the present disclosure is shown not in the foregoing description but in the claims, and it is intended that all modifications that come within the meaning and range of equivalence to the claims are embraced here. These novel embodiments can be carried out in other various modes and susceptible to a variety of omission, replacement, and changes without departing from the spirit of the disclosure. These embodiment and modifications thereof are embraced in the scope and spirit of the disclosure and embraced in the range of equivalence to the disclosure recited in the claims.

REFERENCE SIGNS LIST 1a, 1b, 1c testing system, 2 control circuit, 10 voltage control unit, 11 output voltage command value generator, 11a first computing unit, 11aA, 11bA deviation computing unit, 11aB, 11bB lowpass filter, 11aC, 11bC proportional control unit, 11aD, 11aF, 11bD, 11bF multiplication unit, 11aE addition unit, 11b second computing unit, 11bE subtraction unit, 12, 13 PWM controller, 12a voltage comparator, 20 hysteresis control unit, 100x, 100y power converter, 110 line, 200x, 200y auxiliary converter, 300 hysteresis converter, 301 first leg, 302 second leg, C1 to C3 power storage element, CT1, VT1, VT2 sensor, CTRLon voltage control execution command, D11, D12, D21, D22 antiparallel diode, G11 to G14, G21 to G24, G31 to G34 gate signal, Gd11 to Gd14, Gd21 to Gd24, Gd31 to Gd34 gate drive circuit, Iarm arm current (test current), Iarm* reference current command value, Iarmh upper limit current command value, Iarml lower limit current command value, Idc* DC current command value, Ir determination value, J1, J2 determination step, L1 reactor, Q11 to Q14, Q21 to Q24, Q31 to Q34 switching element, S1 circulation step, S2 voltage control starting step, S3 charging step, T11 output terminal (power converter), T21 output terminal (auxiliary converter), T31, T32 terminal (hysteresis converter), Vc1, Vc2 voltage control command value, Vcap1, Vcap2 capacitor voltage, Vcap* power storage element voltage command value, Vcarr carrier voltage, Vcell1, Vcell2 output voltage command value, Vcell* reference output voltage command value.

The invention claimed is:

1. A testing device for a power converter including a series connection of first and second main switching elements connected in series through a first terminal, and a first power storage element connected in parallel with the series connection of the first and second main switching elements, the testing device comprising:
an auxiliary converter including a series connection of first and second auxiliary switching elements connected in series through a second terminal, and a second power storage element connected in parallel with the series connection of the first and second auxiliary switching elements;
a line configured to electrically connect the power converter and the auxiliary converter,
a current output circuit connected to the first and second terminals, the current output circuit outputting test current for the power converter in accordance with a reference current command value in which an alternating current (AC) current command value and a direct current (DC) current command value are superimposed; and
a control circuit to control the current output circuit, the power converter, and the auxiliary converter, wherein the control circuit
executes circulation operation to fix ON and OFF of the first and second main switching elements and the first and second auxiliary switching elements such that a current path bypassing the first and second power storage elements is formed between the first and second terminals until a DC component of the test current reaches a predetermined level, after start of output of the test current from the current output circuit in accordance with the reference current command value, and starts ON and OFF control of the first and second main switching elements and the first and second auxiliary switching elements for voltage control at least including control of voltages of the first and second power storage elements in accordance with a power storage element voltage command value, after the DC component reaches the predetermined level.

2. The testing device for the power converter according to claim 1, wherein the control circuit fixes, at OFF, the first and second main switching elements and the first and second auxiliary switching elements, in a state in which an AC current that does not include a DC component is supplied from the current output circuit, before the circulation operation, and executes charging operation of charging the first and second power storage elements through a current path via a diode connected in antiparallel with each of the first and second main switching elements and the first and second auxiliary switching elements.

3. The testing device for the power converter according to claim 1, wherein the current output circuit includes
first and second test terminals electrically connected to the first and second terminals, respectively,
a hysteresis converter including a plurality of switching elements, the hysteresis converter converting a DC voltage into a positive pulse voltage or a negative pulse voltage through ON and OFF control of the switching elements and outputting the positive pulse voltage or the negative pulse voltage between the first and second test terminals, and
a reactor connected at least one of: between the first terminal and the first test terminal; and between the second terminal and the second test terminal to allow the test current to pass through, and
the control circuit controls ON and OFF of the switching elements of the hysteresis converter to switch to output of the negative pulse voltage when a detection value of the test current rises to an upper limit current command value set to be higher than the reference current command value at a time of output of the positive pulse voltage, and to switch to output of the positive pulse voltage when a detection value of the test current lowers to a lower limit current command value set to be lower than the reference current command value at a time of output of the negative pulse voltage.

4. The testing device for the power converter according to claim 3, wherein the control circuit controls the hysteresis converter, the power converter, and the auxiliary converter such that charging operation of the first and second power storage elements is executed before the circulation operation, an absolute value of a difference between the reference current command value and the upper limit current command value is equal to an absolute value of a difference between the reference current command value and the lower limit current command value, and the reference current command value is set to zero in the charging operation, and in the charging operation, in the power converter and the auxiliary converter, the first and second main switching elements and the first and second auxiliary switching elements are fixed at OFF, and the first and second power storage elements are charged through a current path via a diode connected in antiparallel with each of the first and second main switching elements and the first and second auxiliary switching elements.

5. The testing device for the power converter according to claim 3, wherein the control circuit controls the hysteresis converter, the power converter, and the auxiliary converter such that charging operation of the first and second power storage elements is executed before the circulation operation, in the charging operation, in the hysteresis converter, ON and OFF of the switching elements are controlled such that a first period in which the positive pulse voltage is output and a second period in which the negative pulse voltage is output appear alternately in accordance with a ratio between respective predetermined period lengths, irrespective of the reference current command value, and in the charging operation, in the power converter and the auxiliary converter, the first and second main switching elements and the first and second auxiliary switching elements are fixed at OFF, and the first and second power storage elements are charged through a current path via diode connected in antiparallel with each of the first and second main switching elements and the first and second auxiliary switching elements.

6. The testing device for the power converter according to claim 1, wherein in the voltage control, in the power converter, ON and OFF of the first and second main switching elements are controlled such that an output voltage of the first terminal follows a first output voltage command value, and in the auxiliary converter, ON and OFF of the first and second auxiliary switching elements are controlled such that an output voltage of the second terminal follows a second output voltage command value, the control circuit, in the voltage control, calculates the first output voltage command value in accordance with a value obtained by adding a first voltage control command value for compensating for a first voltage deviation between a voltage of the first power storage element and the power storage element voltage command value to a reference output voltage command value in which an AC voltage command value and a DC voltage command value are superimposed, and calculates the second output voltage command value in accordance with a value obtained by subtracting a second voltage control command value for compensating for a second voltage deviation between a voltage of the second power storage element and the power storage element voltage command value from the reference output voltage command value, the first voltage control command value is calculated in accordance with multiplication of the first voltage deviation and the reference current command value, and the second voltage control command value is calculated in accordance with multiplication of the second voltage deviation and the reference current command value.

7. The testing device for the power converter according to claim 1, wherein the line electrically connects the power converter and the auxiliary converter by connecting a negative electrode of the first power storage element and a negative electrode of the second power storage element.

8. The testing device for the power converter according to claim 1, wherein the line electrically connects the power converter and the auxiliary converter by connecting a positive electrode of the first power storage element and a positive electrode of the second power storage element.

9. The testing device for the power converter according to claim 1, wherein the power converter further includes third and fourth main switching elements connected in series, a series connection of the third and fourth main switching elements is connected in parallel with the first power storage element, the auxiliary converter further includes third and fourth auxiliary switching elements connected in series, a series connection of the third and fourth auxiliary switching elements is connected in parallel with the second power storage element, and the line electrically connects the power converter and the auxiliary converter by connecting a connection node of the third and fourth main switching elements and a connection node of the third and fourth auxiliary switching elements.

10. The testing device for the power converter according to claim 1, wherein the first and second main switching elements and the first and second auxiliary switching elements are one of an insulated gate bipolar transistor (IGBT) or a metal oxide semiconductor field effect transistor (MOSFET).

11. The testing device for the power converter according to claim 1, further comprising sensor connected in parallel to the first power storage element and the second power storage element, respectively, to sense voltages of the first power storage element and the second power storage element.

12. The testing device for the power converter according to claim 1, wherein the power converter is a modular multilevel converter or a cascaded multilevel converter.

13. A testing method for a power converter including a series connection of first and second main switching elements connected in series through a first terminal, and a first power storage element connected in parallel with the series connection of the first and second main switching elements, wherein the power converter is tested in a state in which the power converter is electrically connected to an auxiliary converter through a line, the auxiliary converter including a series connection of first and second auxiliary switching elements connected in series through a second terminal, and a second power storage element connected in parallel with the series connection of the first and second auxiliary switching elements, the testing method comprising executing, after start of output of test current from a current output circuit connected to the first and second terminals in accordance with a reference current command value in which an alternating current (AC) current command value and
a direct current (DC) current command value are superimposed, a circulation operation until a DC component of the test current reaches a predetermined level; and
starting, after the DC component reaches the predetermined level, ON and OFF control of the first and second main switching elements and the first and second auxiliary switching elements for voltage control at least including control of voltages of the first and second power storage elements in accordance with a power storage element voltage command value,
wherein in the circulation operation, in the power converter and the auxiliary converter, ON and OFF of the first and second main switching elements and the first and second auxiliary switching elements are fixed such that a current path bypassing the first and second power storage elements is formed between the first and second terminals.

14. The testing method for the power converter according to claim 13, further comprising the step of charging the first and second power storage elements in a state in which an AC current that does not include a DC component is supplied from the current output circuit, before execution of the circulation operation,
wherein in the step of charging, the first and second main switching elements and the first and second auxiliary switching elements are fixed at OFF, and the first and second power storage elements are charged through a current path via a diode connected in antiparallel with each of the first and second main switching elements and the first and second auxiliary switching elements.

15. The testing method for the power converter according to claim 13, wherein the current output circuit includes
first and second test terminals electrically connected to the first and second terminals, respectively,
a hysteresis converter including a plurality of switching elements, the hysteresis converter converting a DC voltage into a positive pulse voltage or a negative pulse voltage through ON and OFF control of the switching elements and outputting the positive pulse voltage or the negative pulse voltage between the first and second test terminals, and
a reactor connected at least one of: between the first terminal and the first test terminal; and between the second terminal and the second test terminal to allow the test current to pass through, and
in the hysteresis converter, ON and OFF of the switching elements are controlled to switch to output of the negative pulse voltage when a detection value of the test current rises to an upper limit current command value set to be higher than the reference current command value at a time of output of the positive pulse voltage, and to switch to output of the positive pulse voltage when a detection value of the test current lowers to a lower limit current command value set to be lower than the reference current command value at a time of output of the negative pulse voltage.

16. The testing method for the power converter according to claim 15, further comprising the step of controlling the hysteresis converter, the power converter, and the auxiliary converter such that charging operation of the first and second power storage elements is executed before the circulation operation, wherein
an absolute value of a difference between the reference current command value and the upper limit current command value is equal to an absolute value of a difference between the reference current command value and the lower limit current command value, and the reference current command value is set to zero in the charging operation, and
in the charging operation, in the power converter and the auxiliary converter, the first and second main switching elements and the first and second auxiliary switching elements are fixed at OFF, and the first and second power storage elements are charged through a current path via a diode connected in antiparallel with each of the first and second main switching elements and the first and second auxiliary switching elements.

17. The testing method for the power converter according to claim 15, further comprising the step of controlling the hysteresis converter, the power converter, and the auxiliary converter such that charging operation of the first and second power storage elements is executed before the circulation operation,
wherein in the charging operation, the reference current command value is not set, and in the hysteresis converter, ON and OFF of the switching elements are controlled such that a first period in which the positive pulse voltage is output and a second period in which the negative pulse voltage is output appear alternately in accordance with a ratio between respective predetermined period lengths, and
in the charging operation, in the power converter and the auxiliary converter, the first and second main switching elements and the first and second auxiliary switching elements are fixed at OFF, and the first and second power storage elements are charged through a current path via diode connected in antiparallel with each of the first and second main switching elements and the first and second auxiliary switching elements.

18. The testing method for the power converter according to claim 13, wherein
in the voltage control, in the power converter, ON and OFF of the first and second main switching elements are controlled such that an output voltage of the first terminal follows a first output voltage command value, and in the auxiliary converter, ON and OFF of the first and second auxiliary switching elements are controlled such that an output voltage of the second terminal follows a second output voltage command value,
in the voltage control, the first output voltage command value is calculated in accordance with a value obtained by adding a first voltage control command value for compensating for a first voltage deviation between a voltage of the first power storage element and the power storage element voltage command value to a reference output voltage command value in which an AC voltage command value and a DC voltage command value are superimposed, and in the voltage control, the second output voltage command value is calculated in accordance with a value obtained by subtracting a second voltage control command value for compensating for a second voltage deviation between a voltage of the second power storage element and the power storage element voltage command value from the reference output voltage command value,
the first voltage control command value is calculated in accordance with multiplication of the first voltage deviation and the reference current command value, and the second voltage control command value is calculated in accordance with multiplication of the second voltage deviation and the reference current command value.

19. The testing method for the power converter according to claim 13, wherein in execution of the voltage control after execution of the circulation operation, the reference current command value is set such that a value obtained by integrating an instantaneous power over one cycle of a fundamental wave component of the reference current command value is zero, the instantaneous power being represented by a product of a reference output voltage command value that is a command value of an output voltage of each of the first and second terminals and the reference current command value, and the reference output voltage command value is set such that an AC voltage command value and a DC voltage command value are superimposed.

20. The testing method for the power converter according to claim 13, wherein an instantaneous value of the reference current command value is set to zero at start of output of the test current by the current output circuit.

* * * * *